United States Patent
Kushnir et al.

(10) Patent No.: US 11,558,059 B2
(45) Date of Patent: Jan. 17, 2023

(54) CONCEPT FOR A DIGITAL CONTROLLED LOOP AND A DIGITAL LOOP FILTER

(71) Applicant: Intel Corporation, Santa Clara, CA (US)

(72) Inventors: Igal Kushnir, Hod-Hasharon (IL); Evgeny Shumaker, Nesher (IL); Aryeh Farber, Petah Tikva (IL); Gil Horovitz, Ekem-Hefer (IL)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 17/004,037

(22) Filed: Aug. 27, 2020

(65) Prior Publication Data
US 2021/0203333 A1    Jul. 1, 2021

(30) Foreign Application Priority Data
Dec. 27, 2019  (DE) .......................... 102019135800.0

(51) Int. Cl.
*H03L 7/099* (2006.01)
*H03L 7/093* (2006.01)

(52) U.S. Cl.
CPC ............ *H03L 7/0992* (2013.01); *H03L 7/093* (2013.01); *H03L 2207/50* (2013.01)

(58) Field of Classification Search
CPC ..... H03L 7/099; H03L 7/0991; H03L 7/0992; H03L 7/0993; H03L 7/101; H03L 7/102; H03L 7/103; H03L 7/093; H03L 2207/50
See application file for complete search history.

(56) References Cited

U.S. PATENT DOCUMENTS

| | | | | |
|---|---|---|---|---|
| 2013/0051290 A1* | 2/2013 | Endo | ................... | H04L 27/0014 370/281 |
| 2015/0236682 A1* | 8/2015 | Thian | ................. | H03K 5/00006 341/144 |

\* cited by examiner

*Primary Examiner* — Diana J. Cheng
(74) *Attorney, Agent, or Firm* — 2SPL Patentanwälte PartG mbB; Kieran O'Leary

(57) ABSTRACT

Examples relate to a digitally controlled oscillator circuit arrangement, a digitally controlled oscillation means, a method for a digitally controlled oscillator, a digital loop filter circuit arrangement, a digital loop filtering means, a method for a digital loop filter, a phase locked loop circuit arrangement and phase locked loop, a user device and a base station. The digitally controlled oscillator circuit arrangement comprises input circuitry for obtaining a frequency setting signal, the frequency setting signal comprising a plurality of signal components, selection circuitry for selecting one signal component of the plurality of signal components of the frequency setting signal based on an oscillation signal of the digitally controlled oscillator circuit arrangement, wherein the selection circuitry comprises counting circuitry and multiplexing circuitry, signal generation circuitry for generating the oscillation signal based on the selected signal component of the frequency setting signal, and output circuitry for providing the oscillation signal.

23 Claims, 9 Drawing Sheets

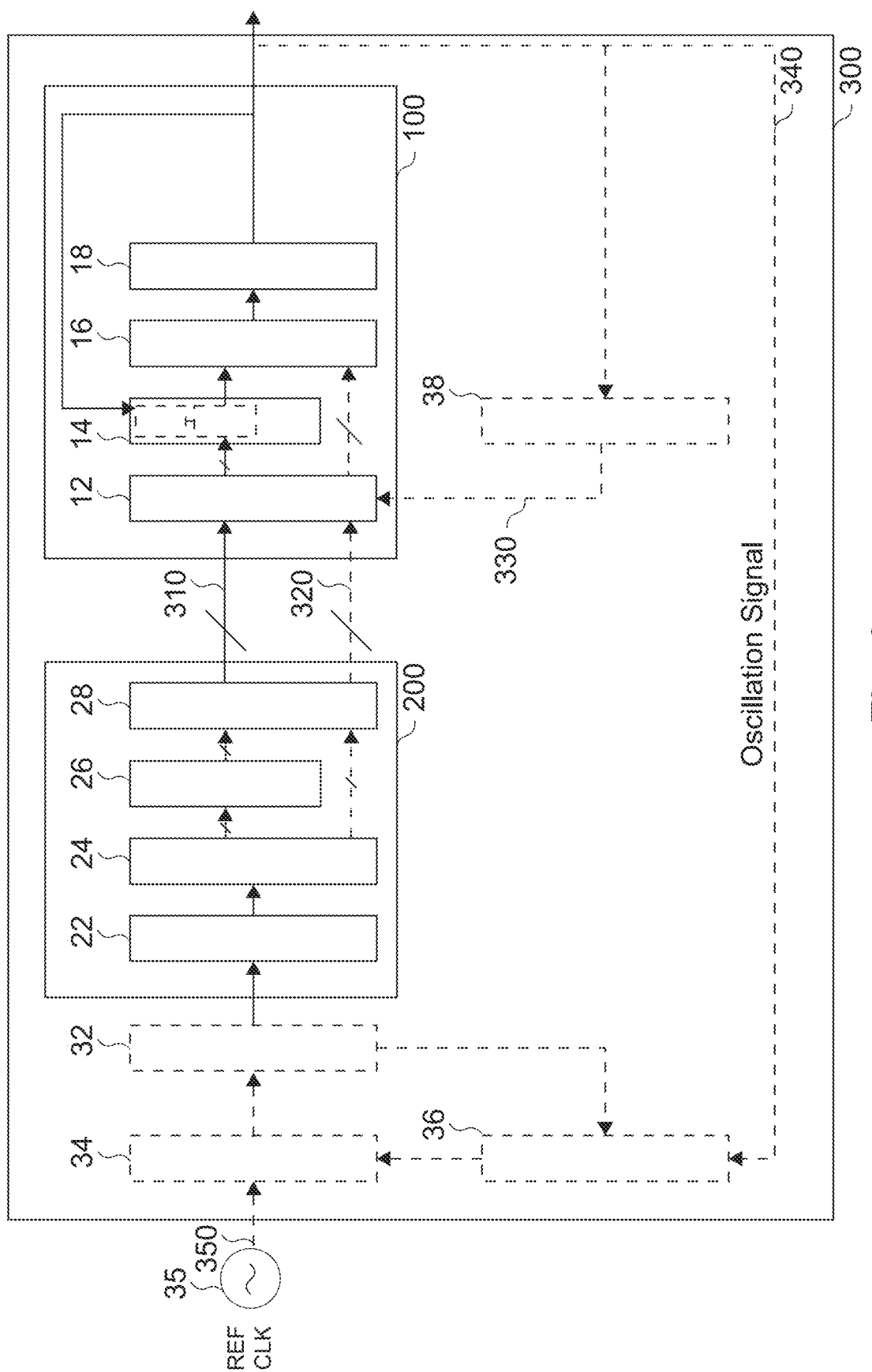

CONCEPT FOR A DIGITAL CONTROLLED LOOP AND A DIGITAL LOOP FILTER

CROSS-REFERENCE TO A RELATED APPLICATION

This application claims priority under 35 U.S.C. § 119(a) to German Application No. 10 2019 135 800.0 filed on Dec. 27, 2019. The contents of the earlier filed application are incorporated by reference herein in their entirety.

FIELD

Examples relate to a digitally controlled oscillator circuit arrangement, a digitally controlled oscillation means, a method for a digitally controlled oscillator, a digital loop filter circuit arrangement, a digital loop filtering means, a method for a digital loop filter, a phase locked loop circuit arrangement and phase locked loop, a user device and a base station.

BACKGROUND

Digital frequency synthesis of radio frequency and even millimeter-wave region carriers is gaining prominence, fueled by the constant improvement of digital performance in the nm-scale silicon processes and steady decline in the analog performance of the latter. These synthesizers, primarily of the phase locked loop variety are termed either Digital Phase-Locked Loops (DPLL) or All-Digital Phase-Locked Loops (ADPLL) depending on the number of discrete quantizers present in the loop. DPLL may have the relative (to reference clock) local oscillator phase quantized and processed in the digital domain, whereas ADPLL may additionally possess a discrete output frequency ladder. Often allowing better design trade-offs in term of achievable spectral purity, the Digitally Controlled Oscillators (DCOs) of the ADPLLs (as opposed to Voltage Controlled oscillators—VCOs—of the DPLLs) may exhibit an instantaneous frequency error due to the aforementioned output frequency quantization.

Frequency error spectral shaping (often termed noise shaping) may be used to both improve the spectral purity of the PLL output and to increase the stability of the entire PLL. This spectral shaping is in some systems achieved by high frequency switching among discrete frequency levels of the DCO, thereby realizing fractional frequency resolution.

The approach taken in some PLLs/DCOs call for a trade-off between achievable frequency resolution and bandwidth covered by a DCO. The remaining frequency error is then noise-shaped by a noise-shaping mechanism driven by a moderate division of the Local Oscillator (LO) frequency. Usually, Sigma-Delta modulators of various orders are employed.

Parasitic capacitances may set the lowest achievable frequency resolution in state-of-the-art DCOs, with atto-Farad scale capacitances being already widely employed. This limit puts the different design parameters (such as bandwidth) at odds with each other (e.g. phase noise performance). The effectiveness of Sigma-Delta Modulators may be limited by the ability of digital circuitry to operate at high-frequency.

BRIEF DESCRIPTION OF THE FIGURES

Some examples of apparatuses and/or methods will be described in the following by way of example only, and with reference to the accompanying figures, in which

FIG. 3 shows a block diagram of an example of a phase locked loop;

DETAILED DESCRIPTION

Various examples will now be described more fully with reference to the accompanying drawings in which some examples are illustrated. In the figures, the thicknesses of lines, layers and/or regions may be exaggerated for clarity.

Accordingly, while further examples are capable of various modifications and alternative forms, some particular examples thereof are shown in the figures and will subsequently be described in detail. However, this detailed description does not limit further examples to the particular forms described. Further examples may cover all modifications, equivalents, and alternatives falling within the scope of the disclosure. Same or like numbers refer to like or similar elements throughout the description of the figures, which may be implemented identically or in modified form when compared to one another while providing for the same or a similar functionality.

It will be understood that when an element is referred to as being "connected" or "coupled" to another element, the elements may be directly connected or coupled via one or more intervening elements. If two elements A and B are combined using an "or", this is to be understood to disclose all possible combinations, i.e. only A, only B as well as A and B, if not explicitly or implicitly defined otherwise. An alternative wording for the same combinations is "at least one of A and B" or "A and/or B". The same applies, mutatis mutandis, for combinations of more than two Elements.

The terminology used herein for the purpose of describing particular examples is not intended to be limiting for further examples. Whenever a singular form such as "a," "an" and "the" is used and using only a single element is neither explicitly or implicitly defined as being mandatory, further examples may also use plural elements to implement the same functionality. Likewise, when a functionality is subsequently described as being implemented using multiple elements, further examples may implement the same functionality using a single element or processing entity. It will be further understood that the terms "comprises," "comprising," "includes" and/or "including," when used, specify the presence of the stated features, integers, steps, operations, processes, acts, elements and/or components, but do not preclude the presence or addition of one or more other features, integers, steps, operations, processes, acts, elements, components and/or any group thereof.

Unless otherwise defined, all terms (including technical and scientific terms) are used herein in their ordinary meaning of the art to which the examples belong.

Figure 1A:
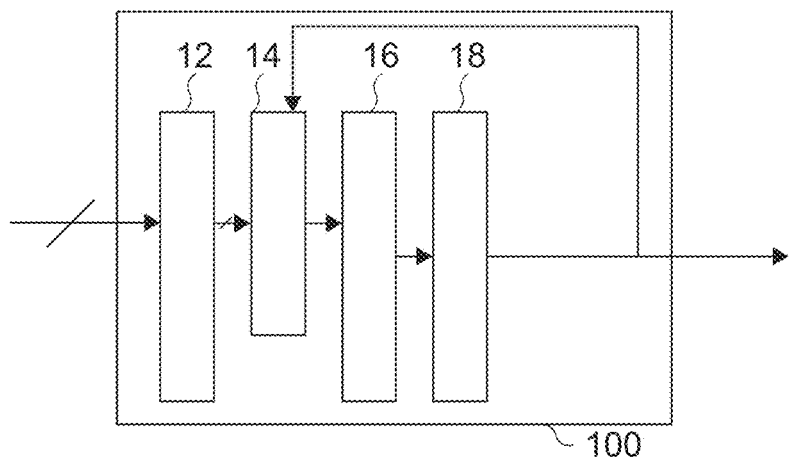
FIGS. 1a and 1b show block diagrams of examples of a digitally controlled oscillator circuit arrangement, of a digitally controlled oscillating means or of a digitally controlled oscillator.
Figure 1B:
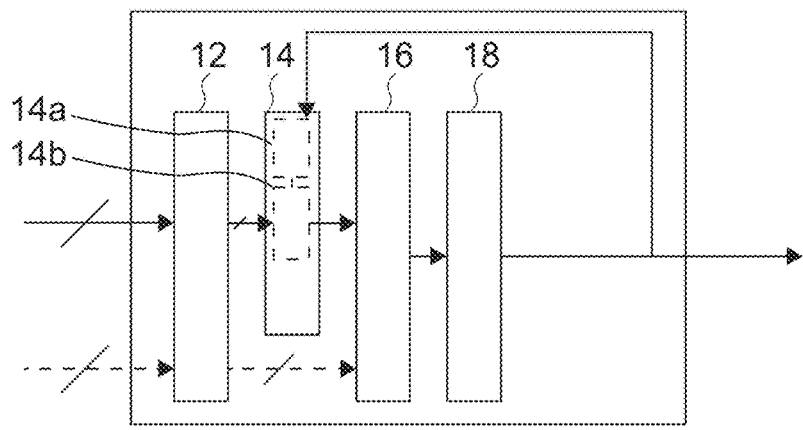

FIGS. 1a and 1b show block diagrams of examples of a digitally controlled oscillator circuit arrangement, of a digitally controlled oscillating means 100, i.e. of a digitally controlled oscillator 100. The components of the digitally controlled oscillating means 100 are defined as component means, which correspond to the respective structural components of the digitally controlled oscillator circuit arrangement 100.

The digitally controlled oscillator circuit arrangement 100 comprises input circuitry 12 (e.g. input means for the digitally controlled oscillating means) for obtaining a frequency setting signal. The frequency setting signal comprises a plurality of signal components. The digitally controlled oscillator circuit arrangement 100 comprises selection circuitry 14 (e.g. selection means 14) for selecting one signal component of the plurality of signal components of the frequency setting signal based on an oscillation signal of the digitally controlled oscillator circuit arrangement. The digitally controlled oscillator circuit arrangement 100 comprises signal generation circuitry 16 (e.g. signal generation means) for generating the oscillation signal based on the selected signal component of the frequency setting signal. The digitally controlled oscillator circuit arrangement 100 comprises output circuitry 18 (e.g. output means 18) for providing the oscillation signal.

Figure 1C:
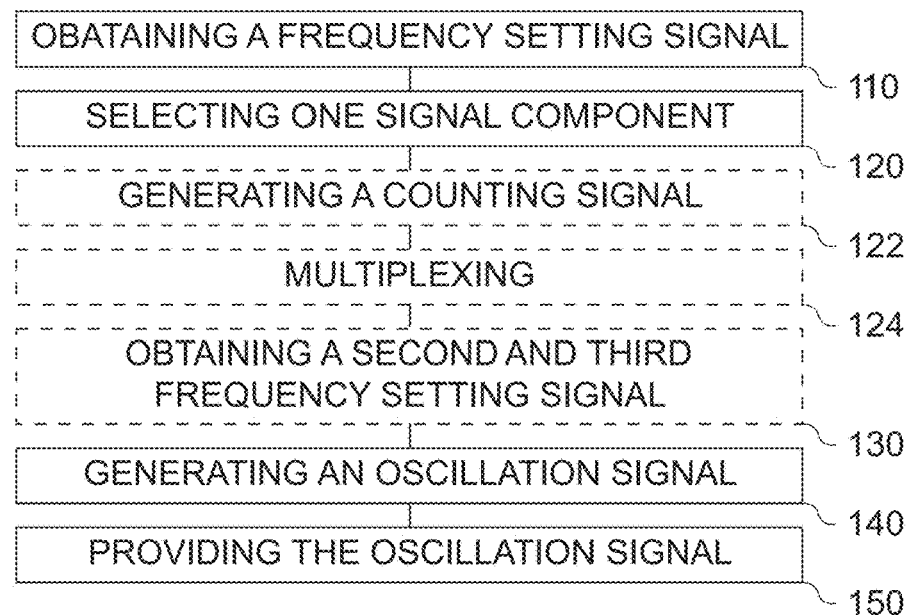
FIG. 1c shows a flow chart of an example of a method for a digitally controlled oscillator.

FIG. 1c shows a flow chart of an example of a (corresponding) method for a digitally controlled oscillator 100. The method comprises obtaining 110 a frequency setting signal. The frequency setting signal comprises a plurality of signal components. The method comprises selecting 120 one signal component of the plurality of signal components of the frequency setting signal based on an oscillation signal of the digitally controlled oscillator. The method comprises generating 140 the oscillation signal based on the selected signal component of the frequency setting signal. The method comprises providing 150 the oscillation signal. While The method of FIG. 1c is written as a flow chart, it is evident to the person skilled in the art that, in (analog) circuit arrangements, signals being fed into the circuit arrangement can lead to changes in voltages, currents, capacitances etc. in a concurrent manner. Consequently, the flow chart is to be understood in a non-consecutive manner, in which some features of the flow chart may occur at the same time.

The following description relates to the digitally controlled oscillator circuit arrangement or digitally controlled oscillating means 100 of FIGS. 1a and/or 1b, and to the corresponding method of FIG. 1c. Features that are introduced in the context of the digitally controlled oscillator circuit arrangement or digitally controlled oscillating means 100 may readily be applied to the corresponding method.

Examples shown in connection with FIGS. 1a to 1c relate to a digitally controlled oscillator (DCO), as implemented by the respective circuit arrangement, means and method. In various examples, the digitally controlled oscillator is part of a phase locked loop, e.g. an all-digital phase locked loop (PLL). Within the phase locked loop, the digitally controlled oscillator may be used to generate the (local) oscillation signal, i.e. the output signal of the phase locked loop. Within the phase-locked loop, a phase detector may compare the oscillation signal to a reference signal, in order to determine whether the oscillation signal is generated at the right frequency, e.g. at a precise multiple of the reference signal. Despite its name, a DCO may be implemented as a purely analog part. The portion that is "digital" in the DCO is the means of selection of the active LC tank capacitance, which is used to set the oscillation frequency. The output of this circuit are naturally occurring voltage oscillations which can be considered as a digital wave of alternating values 0-1-0-1-0-1.

The digitally controlled oscillator circuit arrangement comprises input circuitry 12. The input circuitry is configured to obtain (i.e. receive) a (first) frequency setting signal, e.g. from a digital loop filter (DLF) 200, e.g. as shown in FIGS. 2a to 5d. Optionally, the input circuitry may be configured to (additionally) obtain/receive 130 a second frequency setting signal and a third frequency setting signal. The second frequency setting signal might also be received from the DLF 200, while the third frequency setting signal might be received from an automatic band selector (ABS), e.g. ABS 38 as shown in FIGS. 2a to 5d.

In the context of this application, three frequency setting signals may be distinguished, a (first) frequency setting signal that is used for setting the parameters of the noise shaping of the frequency generated digitally controlled oscillator, by setting fractional values of the frequency generated by the DCO, the second frequency setting signal (sometimes also denoted FT) that is used for setting the frequency generated by the digitally controlled oscillator at the integer level, and the third frequency setting signal (sometimes also denoted CT) for setting a frequency band of the digitally controlled oscillator. Consequently, the frequency setting signal may be a fractional frequency setting signal. The second frequency setting signal may be an integer frequency setting signal. The third frequency setting signal may be a frequency band setting signal. Together, the three frequency setting signals may be used to set and/or adjust the frequency of the oscillation signal being generated by the digitally controlled oscillator. While the order of the first, second and third frequency setting signal is chosen, in the context of the application, in order of their appearance, within the digitally controlled oscillator, the frequency setting signal for setting the frequency band of the digitally controlled oscillator may be considered the "first", as it is used first to set the frequency band and as it influences the largest capacitors, the frequency setting signal that is used for setting the frequency generated by the digitally controlled oscillator at the integer level may be considered the "second", and the frequency setting signal that is used for setting the parameters of the noise shaping of the frequency generated digitally controlled oscillator may be considered the "third".

In examples, the frequency setting signal comprises a plurality of signal components. These signal components are comprised in the frequency setting signal so they can be used, by the signal generation circuitry 16, to generate the oscillation signal at various points during a single cycle of a reference signal that is being used to drive the digital loop filter. For example, the frequency setting signal (and the second frequency setting signal) may be based on a signal indicative of a timing difference between a reference signal and the oscillation signal. In other words, the signal indicative of the timing difference between the reference signal and the oscillation signal may indicate a phase distance and/or a timing offset between the oscillation signal and the reference signal. In many cases, the PLL comprises a divider to divide the oscillation signal before comparison with the reference signal. Such a circuit arrangement is used to obtain an oscillation signal that has a frequency that is a multiple of the frequency of the reference signal. In this case, the signal indicative of the timing difference between the reference signal and the oscillation signal may indicate a phase distance and/or a timing offset between the divided oscillation signal and the reference signal. The plurality of signal components may comprise (or consist of) N signal components. These N signal components may be used, by the signal generation circuitry, during N fractions of the reference signal. In some examples, N may be equal to the division factor of the divider. In some cases, N may be a fraction (or multiple) of the division factor of the divider. In any case, during a single cycle/period of the reference signal, N different signal components of the frequency setting signal may be used to adjust the oscillation signal. The usage of alternating values (within the plurality of (i.e. N) signal components) in the frequency setting signal across a reference signal cycle may result in a fractional frequency setting of the oscillation signal. Accordingly, the frequency setting signal may be suitable for noise shaping the frequency error of the oscillation signal, e.g. by adjusting a fractional component of the frequency of the oscillation signal. Accordingly, the frequency setting signal is suitable for adjusting a fractional frequency setting of the oscillation signal.

In many examples, the (first) frequency setting signal and/or the second frequency setting signal may be updated at the frequency of the reference signal, e.g. (exactly) once per cycle of the reference signal. This may enable an operation of the digital loop filter at the frequency of the reference signal, and not at the oscillation frequency, which often is a multiple of the reference signal. For example, both the first and the second frequency setting signal may be updated at the same time, e.g. triggered by a cycle of the reference signal. But also within the (first) frequency setting signal, (all of) the signal components may be updated at the same time. In other words, the plurality of signal components may be updated at the same time within the frequency setting signal. Also, the plurality of signal components may be obtained in parallel, e.g. as a parallel signal. For example, the plurality of signal component of the frequency setting signal may be obtained in parallel from the digital loop filter, e.g. as a parallel signal. For example, the plurality of signal components may each be provided via individual signal lines to the digitally controlled oscillator circuit arrangement. This may enable the provision of all of the signal components at the same time, such that the first frequency setting signal only has to be updated at the rate of the reference signal, while being available at the digitally controlled oscillator.

Figure 5A:
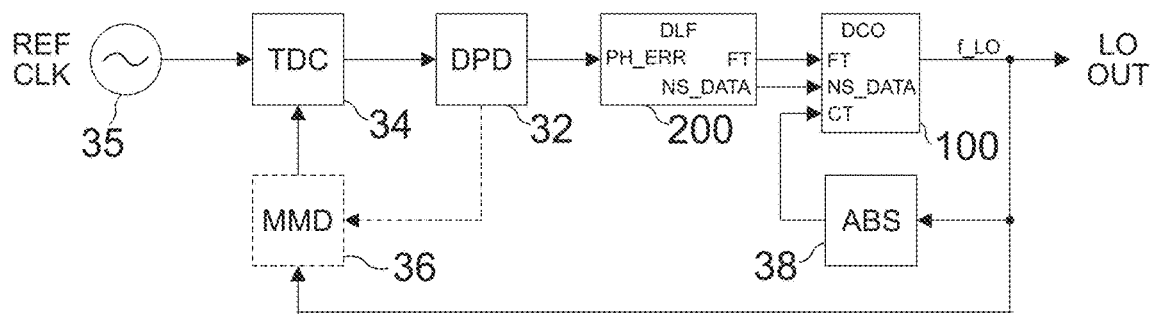
FIG. 5a shows a schematic structure of an example of an all-digital phase locked loop.

The digitally controlled oscillator circuit arrangement comprises the selection circuitry 14 for selecting (exactly) one signal component of the plurality of signal components of the frequency setting signal (at a time). The selection is based on the oscillation signal of the digitally controlled oscillator circuit arrangement. For example, the selection may be triggered by the oscillation signal, e.g. every cycle or every n-th cycle of the oscillation signal. For example, the selection may be based on a divided version of the oscillation signal. Accordingly, the selection circuitry may comprise a divider 14c, as shown in FIG. 5c. For example the square wave introduced above may be divided down in frequency and is used to drive the digital noise shaping mechanism. The selection circuitry may be configured to cycle through the plurality of signal components, e.g. such that each signal component is selected (exactly) once every cycle of the reference signal.

In various examples, a counter and a multiplexer may implement the selection circuitry 14. In other words, the selection circuitry may comprise counting circuitry 14a (e.g. counting means 14a) and multiplexing circuitry 14b (e.g. multiplexing means 14b). The multiplexing circuitry may be configured to select 124 the signal component of the frequency setting signal based on a counting signal of the counting circuitry. For example, the counting cycle may cause the multiplexing circuitry to cycle through the portions of the multiplexing signal. The counting signal may be generated by the counting circuitry. In other words, the counting circuitry may be configured to generate 122 the counting signal based on the oscillation signal of the digitally controlled oscillator. For example, the counting circuitry may be implemented using one of a cyclic shift register, an arithmetic counter and a ripple counter. The combination of the multiplexing circuitry and the counting circuitry may be used to select a different signal component at each (of the N) fraction/fractions of the reference signal. In some examples, the counting circuitry may be configured to control the multiplexing circuitry to select a different signal component of the frequency setting signal at a rate corresponding to the oscillation frequency of the oscillation signal. This may enable a particularly effective noise shaping of the oscillation signal, while requiring a larger number of signal components. Alternatively, counting circuitry may be configured to control the multiplexing circuitry to select a different signal component of the frequency setting signal at a fraction of a rate corresponding to the oscillation frequency of the oscillation signal. This may require fewer signal components, and may achieve a less effective noise shaping of the oscillation signal. The fraction of the rate may be obtained by using a divider 14c to divide the oscillation signal, and by using the divided oscillation signal for the counting circuitry.

The digitally controlled oscillator circuit arrangement comprises signal generation circuitry 16 for generating the oscillation signal based on the selected signal component of the frequency setting signal. For example, the signal generation circuitry 16 may comprise a (LC) resonant circuit comprising capacitors, e.g. digitally controlled capacitors. In general, in digitally controlled oscillators, capacitors, such as varactors are used to set the frequency of the PLL. For example, the third frequency setting signal may be used to select an appropriate setting for large capacitors, which is often termed sub-band—a range of frequencies that are accessible during the phase locking process. In other words, the third frequency setting signal may be suitable for selecting a frequency band of the oscillation signal. In addition, a mechanism availing frequency tuning per phase locking requirements may be used. It may be realized by two either separate or combined mechanisms.

The first is commonly denoted fine tune (FT) and comprise a capacitor matrix (a.k.a. the digital varactor). The fine tune capacitor matrix may be controlled by the second frequency setting signal. In other words, the second frequency setting signal being may be suitable for adjusting the frequency of the oscillation signal in integer steps. Capacitor size in this matrix determines the frequency resolution and may be controlled by the frequency setting signal. Accordingly, the signal generation circuitry may be configured to generate the oscillation signal further based on the second and third frequency setting signals.

The second is the noise-shaping (NS) capacitor bank (can be realized both as a separate bank of capacitors or part of the matrix above) and it's responsible for availing the fractional frequency resolution. A noise-shaping mechanism can be a Sigma-Delta modulator, or any other applicable filtering mechanism. Its input may be the signal components of the frequency setting signal (which determine the average output value) and its logic is driven by a high frequency clock (usually, a divided down version of the oscillation signal) to avail the required averaging effect.

In examples, in contrast to other approaches, instead of expecting a frequency setting signal that is updated at the update rate of the noise shaping mechanism, the frequency setting signal is updated at a lower rate, but comprises the plurality of signal components that are pre-computed for the plurality of updates being performed during a single cycle of the reference signal. For example, as has been laid out above, the plurality of signal components may comprise N signal components. The signal generation circuitry may be configured to sequentially use the N signal components to adjust the oscillation signal during a single period of the reference signal. In other words, the signal generation circuitry may be configured to apply noise shaping N times during a single cycle of the reference signal, based on the N signal components of the frequency setting signal.

An input, e.g. the input circuitry/means 12 may correspond to an interface for receiving information, which may be in digital (bit) values according to a specified code, within a module, between modules or between modules of different entities. An output, e.g. the output circuitry/means 18 may correspond to an interface for transmitting information, which may be represented by digital (bit) values according to a specified code or protocol, within a module, between modules, or between modules of different entities. In embodiments the selection circuitry/means 14 and/or the signal generation circuitry/means 16 may be implemented using circuitry that implements the respective functionality, such as one or more integrated circuits, one or more processing units, one or more processing devices, any means for processing, such as a processor, a computer or a programmable hardware component being operable with accordingly adapted software. In other words, the described function of the respective circuitry/means 14; 16 may as well be implemented in software, which is then executed on one or more programmable hardware components. Such hardware components may comprise a general-purpose processor, a Digital Signal Processor (DSP), a micro-controller, etc.

More details and aspects of the digitally controlled oscillator circuit arrangement, means and method are mentioned in connection with the proposed concept or one or more examples described above or below (e.g. FIGS. 2a to 5d). The digitally controlled oscillator circuit arrangement, means and method may comprise one or more additional optional features corresponding to one or more aspects of the proposed concept or one or more examples described above or below.

Figure 2A:
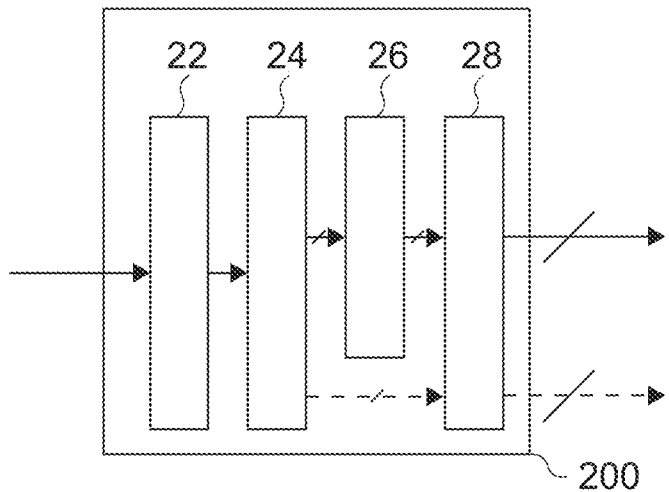
FIG. 2a shows a block diagram of an example of a digital loop filter circuit arrangement, of a digital loop filtering means or of a digital loop filter.

FIG. 2a shows a block diagram of an example of a digital loop filter circuit arrangement 200, of a digital loop filtering means 200, i.e. of a digital loop filter 200. The components of the digital loop filtering means 200 are defined as component means, which correspond to the respective structural components of the digital loop filter circuit arrangement 200.

The digital loop filter circuit arrangement 200 comprises input circuitry 22 (e.g. input means 22 of the digital loop filtering means 200) for obtaining a signal indicative of a timing difference between a reference signal and an oscillation signal of a digitally controlled oscillator circuit arrangement. The digital loop filter circuit arrangement 200 comprises frequency setting signal generation circuitry 24 (e.g. frequency setting signal generation means 24) configured to generate, for each signal period of the reference signal, an integer and a fractional frequency setting, for adjusting the frequency of the digitally controlled oscillator circuit arrangement based on the signal indicative of a timing difference. The digital loop filter circuit arrangement 200 comprises noise shaping signal generation circuitry 26 (e.g. noise shaping signal generation means 26) that is configured to process the fractional frequency setting into a plurality of frequency setting values. The digital loop filter circuit arrangement 200 comprises output circuitry 28 (e.g. output means) for providing a frequency setting signal for the digitally controlled oscillator circuit arrangement. The frequency setting signal comprises a plurality of signal components. The plurality of signal components are based on the plurality of frequency setting values.

Figure 2B:
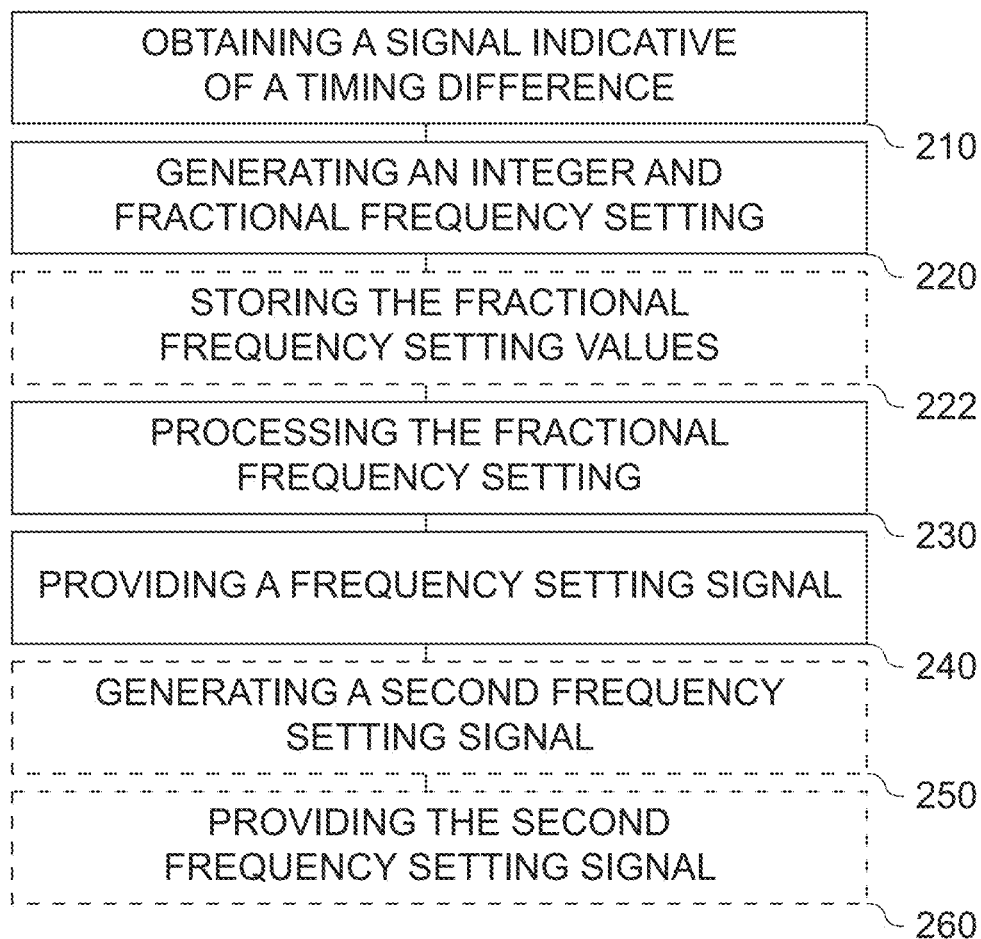
FIG. 2b shows a flow chart of an example of a method for a digital loop filter.

FIG. 2b shows a flow chart of an example of a (corresponding) method for a digital loop filter 200. The method comprises obtaining 210 a signal indicative of a timing difference between a reference signal and an oscillation signal of a digitally controlled oscillator. The method comprises generating 220, for each signal period of the reference signal, an integer and a fractional frequency setting, for adjusting the frequency of the digitally controlled oscillator based on the signal indicative of a timing difference. The method comprises processing 230 the fractional frequency setting into a plurality of frequency setting values. The method comprises providing 240 a frequency setting signal for the digitally controlled oscillator, the frequency setting signal comprising a plurality of signal components. The plurality of signal components are based on the plurality of frequency setting values. While The method of FIG. 2b is written as a flow chart, it is evident to the person skilled in the art that, in (analog) circuit arrangements, signals being fed into the circuit arrangement can lead to changes in voltages, currents, capacitances etc. in a concurrent manner. Consequently, the flow chart is to be understood in a non-consecutive manner, in which some features of the flow chart may occur at the same time.

The following description relates to the digital loop filter circuit arrangement/digital loop filtering means 200 of FIG. 2a, and to the corresponding method of FIG. 2b. Features that are introduced in the context of the digital loop filter circuit arrangement/digital loop filtering means 200 may readily be applied to the corresponding method.

Examples shown in connection with FIGS. 2a and 2b relate to a digital loop filter (DLF) 200, as implemented by the respective circuit arrangement, means and method. In various examples, the DLF is part of a PLL, e.g. an all-digital PLL. Within the phase locked loop, the DLF may be used to generate the frequency setting signal (e.g. the first and second frequency setting signal) for the DCO, based on a timing difference between the oscillation signal and the reference signal. For example, the (first and second) frequency setting signal may be generated to align (a divided version of the) oscillation signal with the reference signal.

The digital loop filter circuit arrangement comprises input circuitry 22 for obtaining a signal indicative of a timing difference between a reference signal (of a reference clock 35) and an oscillation signal (of a digitally controlled oscillator circuit arrangement 100). For example, the signal indicative of a timing difference between the reference signal and the oscillation signal may be obtained from a (digital) phase detector (DPD) 32.

The digital loop filter circuit arrangement comprises frequency setting signal generation circuitry 24 configured to generate, for each signal period of the reference signal, an integer and a fractional frequency setting based on the signal indicative of a timing difference. The integer and a fractional frequency setting is/are suitable for adjusting the frequency of the digitally controlled oscillator circuit arrangement. In other words, the integer and a fractional frequency setting may be based on the timing difference (i.e. may represent the timing difference), and may be suitable for counteracting the timing difference when used by the digitally controlled oscillator (in form of the first and second frequency setting signal).

In addition, the digital loop filter circuit arrangement comprises noise shaping signal generation circuitry 26 that is configured to process the fractional frequency setting into a plurality of frequency setting values. In other words, the noise shaping signal generation circuitry 26 may be configured to generate the plurality of frequency setting values by processing the fractional frequency setting. For example, as has been introduced above, the frequency of the oscillation signal may be adjusted on a fractional level by alternating between different values, thereby creating a "virtual frequency setting". The "virtual" frequency setting obtained through this mechanism can lie anywhere in between any two real (what is commonly referred to as integer) frequency settings. Consequently, the noise shaping signal generation circuitry 26 may be configured to generate the plurality of frequency setting values such, that the fractional frequency setting is applied when the plurality of frequency setting values are used (as plurality of frequency setting values) by the digitally controlled oscillator 100. The frequency setting signal may be suitable for adjusting a fractional frequency setting of the oscillation signal. For example, the frequency setting signal may be suitable for noise shaping of the frequency error of the oscillation signal.

In various examples, a non-recursive algorithm may be used to generate the plurality of frequency setting values, e.g. to enable a parallelization of the generation of the plurality of frequency setting values. For example, the plurality of frequency setting values may be generated based on a closed-form expression (i.e. a mathematical expression that can be evaluated in a finite number of operations) that is based on the required fractional frequency setting. This may be done in parallel, e.g. to avoid having a deep pipeline that introduces delays in the generation of the respective values. Accordingly, the plurality of frequency setting values may be generated in parallel. Furthermore, the frequency setting signal with the plurality of signal components (that correspond to the plurality of frequency setting values) may be provided in parallel. In other words, the plurality of signal component of the frequency setting signal may be provided in parallel to the digitally controlled oscillator circuit arrangement. For example, the plurality of signal components are each provided via individual signal lines to the digitally controlled oscillator circuit arrangement. Accordingly, the plurality of signal components may be updated at the same time within the frequency setting signal.

Figure 5B:
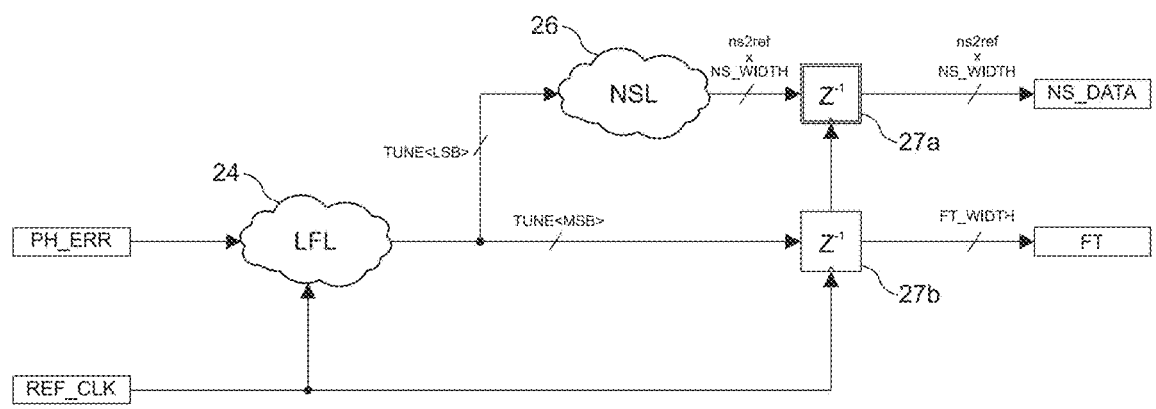
FIG. 5b shows a schematic structure of an example of a digital loop filter.
Figure 5C:
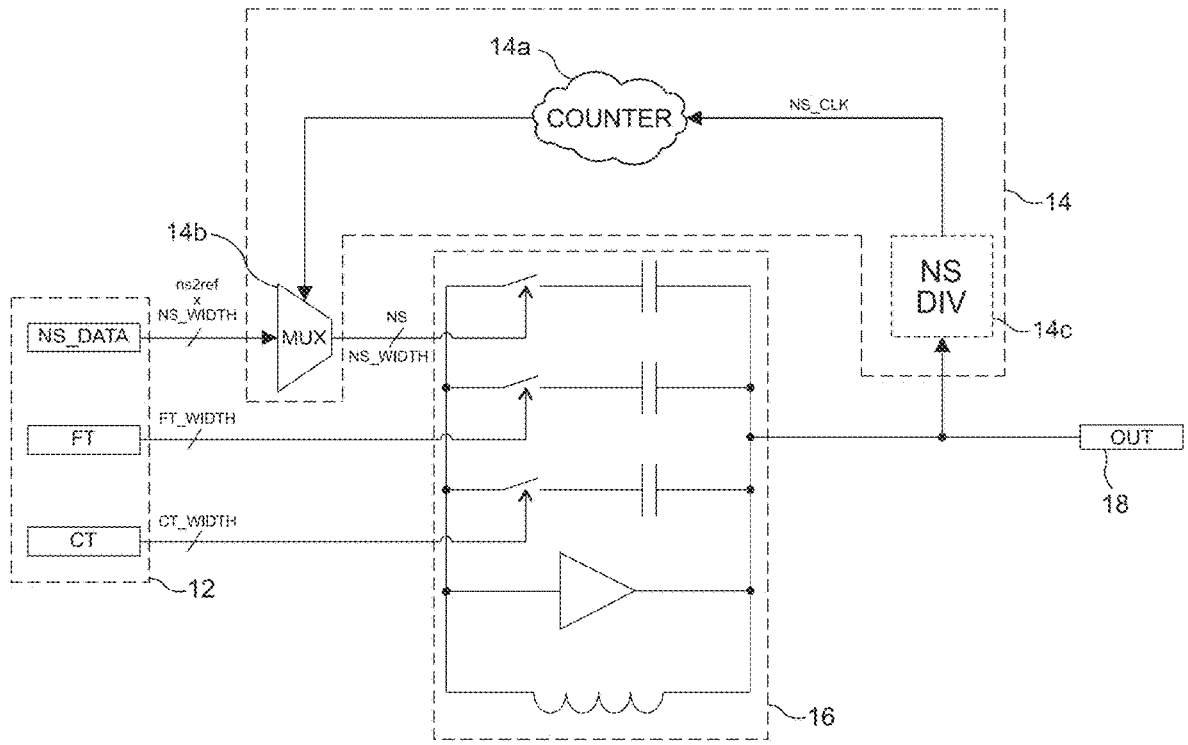
FIG. 5c shows a schematic structure of an example of a digitally controlled oscillator.

In some examples, this may be achieved by storing the fractional frequency setting values in a memory, e.g. memory circuitry or memory means (FlipFlop 27a, as shown in FIG. 5b), and generating the frequency setting signal based on the values stored in the memory 27a. For example, the digital loop filter circuit arrangement may comprise memory circuitry. The frequency setting signal generation circuitry may be configured to store 222 the plurality of frequency setting values using the memory circuitry. The output circuitry may be configured to generate the frequency setting signal using the plurality of frequency setting values stored in the memory circuitry. For example, the memory may be configured to output the frequency setting signal based on the frequency setting values, and the output circuitry may be configured to output the frequency setting signal to the digitally controlled oscillator. In addition, the digital loop filter circuit arrangement may comprise memory circuitry (27b in FIG. 5c) for storing the integer frequency setting.

In addition to the (first) frequency setting signal, the digital loop filter may provide a second frequency setting signal to the digitally controlled oscillator. In other words, the frequency setting signal generation circuitry may be configured to generate 250 a second frequency setting signal based on the integer frequency setting. Accordingly, the second frequency setting signal may be suitable for adjusting the frequency of the oscillation signal in integer steps. The output circuitry may be configured to provide 260 the second frequency setting signal to the digitally controlled oscillator (circuit arrangement). For example, the output circuitry may be configured to generate the frequency setting signal using the integer frequency setting stored in the memory circuitry In many examples, the digital loop filter be operated at a lower frequency than the digitally controlled oscillator. For example, the digital loop filter may be operated at the frequency of the reference signal, and the digitally controlled oscillator may be operated at the frequency of the oscillation signal. Accordingly, both the frequency setting signal and the second frequency setting signal may be generated, updated and provided based on the reference signal, at the frequency of the reference signal. The frequency setting signal may be updated at the same frequency as the second frequency setting signal.

An input, e.g. the input circuitry/means 22 may correspond to an interface for receiving information, which may be in digital (bit) values according to a specified code, within a module, between modules or between modules of different entities. An output, e.g. the output circuitry/means 28 may correspond to an interface for transmitting information, which may be represented by digital (bit) values according to a specified code or protocol, within a module, between modules, or between modules of different entities. In embodiments the frequency setting signal generation circuitry/means 24 and/or the noise shaping signal generation circuitry/means 26 may be implemented using circuitry that implements the respective functionality, such as one or more integrated circuits, one or more processing units, one or more processing devices, any means for processing, such as a processor, a computer or a programmable hardware component being operable with accordingly adapted software. In other words, the described function of the circuitry/means 24; 26 may as well be implemented in software, which is then executed on one or more programmable hardware components. Such hardware components may comprise a general-purpose processor, a Digital Signal Processor (DSP), a micro-controller, etc.

More details and aspects of the digital loop filter circuit arrangement, means and method are mentioned in connection with the proposed concept or one or more examples described above or below (e.g. FIG. 1a to 1c, 3a to 5d). The digital loop filter circuit arrangement, means and method may comprise one or more additional optional features corresponding to one or more aspects of the proposed concept or one or more examples described above or below.

FIG. 3 shows a block diagram of an example of a phase locked loop 300, e.g. of a phase locked loop circuit arrangement, comprising the digitally controlled oscillator circuit arrangement/digitally controlled oscillating means 100 as introduced in the context of FIGS. 1a to 2c, and the digital loop filter circuit arrangement/digital loop filtering means 200 as introduced in the context of FIGS. 2a and 2b. For example, the phase locked loop circuit arrangement may be an all-digital phase locked loop circuit arrangement.

The phase locked loop 300 may comprise various further components, such as a phase detector 32, a Time-to-Digital converter 34, a divider 36 and/or an automatic band selector 38. For example, the phase locked loop 300 may comprise a phase detector 32, configured to generate the signal indicative of the time difference based on the reference signal and based on the oscillation signal. The phase locked loop 300 may be supplied with the reference signal by a reference clock 35, which may be internal or external to the PLL. In FIG. 3, the respective signals are shown between the components of the PLL. 310 denotes the (first) frequency setting signal, 320 the second frequency setting signal and 330 the third frequency setting signal. 340 denotes the oscillation signal, and 350 denotes the reference signal, as supplied by the reference clock, before processing performed by the time-to-digital converter.

More details and aspects of the phase locked loop are mentioned in connection with the proposed concept or one or more examples described above or below (e.g. FIG. 1a to 2b, 4a to 5d). The phase locked loop may comprise one or more additional optional features corresponding to one or more aspects of the proposed concept or one or more examples described above or below.

At least some examples relate to high-frequency noise shaping based on low-rate pre-computed values (e.g. the plurality of setting values/plurality of signal components of the frequency setting signal). Examples propose a system and method of achieving fractional frequency resolution by means of precomputed frequency modulation streams, thereby allowing frequency error spectral shaping of arbitrary complexity and rate.

Figure 4A:
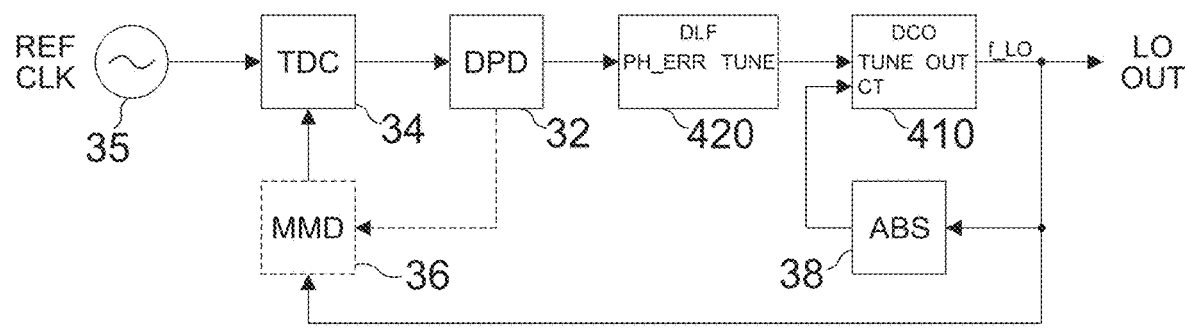
FIG. 4a shows an example of a fractional all-digital phase locked loop.

FIG. 4a depicts a typical Fractional-ADPLL layout, referring to both divider-less and Multi-Modulus-Divider based architectures. The ADPLL layout of FIG. 4a comprises a reference clock 35, an optional multi-modal divider (MMD) 36, a TDC 34, a DLF 420, a DCO 410, and an ABS 38. The TDC obtains the reference signal from the reference clock, and either the oscillation signal or a divided oscillation signal from the DCO or from the MMD, which is supplied with the oscillation signal by the DCO. The DPD receives the output of the TDC, and supplies a feedback signal to the MMD. The output PH_ERR (phase error) of the DPD is supplied to the DLF, which provides a TUNE signal to the DCO. The ABS is operated at the frequency acquisition stage of operation to automatically select the best suitable sub-band based on cycle count measurements performed on the local oscillator (LO) signal, setting the Coarse Tune (CT) signal to the DCO. The DCO generates the LO signal of f_LO frequency and provides the signal at the output of the PLL, and to the ABS and the MMD/TDC.

Figure 4B:
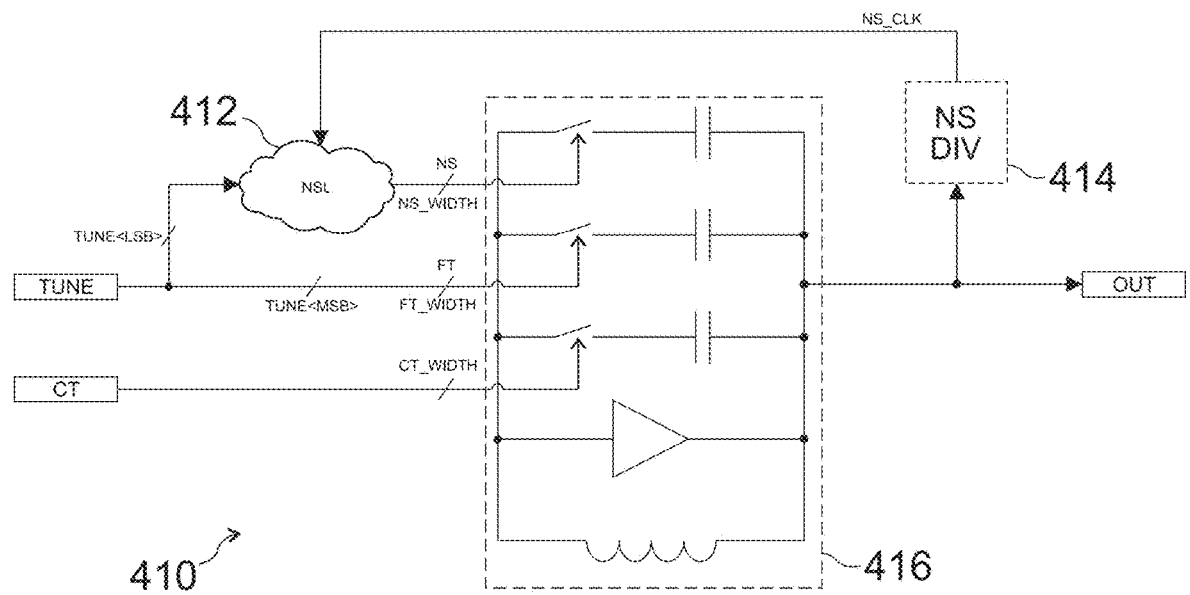
FIG. 4b shows an example of a digitally controlled oscillator of a fractional all-digital phase locked loop.

The DCO, as also shown in FIG. 4b, will usually feature several separate frequency control mechanisms. Coarse tune (CT) is used to select an appropriate setting for the large capacitors which is often termed sub-band—a range of frequencies that are accessible during the phase locking process. TUNE is the mechanism availing frequency tuning per phase locking requirements. It is commonly realized by two either separate or combined mechanisms. The first is commonly denoted fine tune (FT) and comprise a capacitor matrix (a.k.a. the digital varactor). Capacitor size in this matrix determines the frequency resolution and is usually controlled by the upper bits of the TUNE. The second is the noise-shaping (NS) capacitor bank (can be realized both as a separate bank of capacitors or part of the matrix above) and it's responsible for availing the fractional frequency resolution. In FIG. 4b, both is realized in block 416, which comprises capacitors for the NS, FT and CT frequency adjustment, which are controlled by switches that are driven by the NS, FT and CT signals, an amplifier (e.g. an inverting amplifier) and an inductive element.

A noise-shaping mechanism 412 (i.e. Noise Shaping Logic, NSL) can be a Sigma-Delta modulator, or any other applicable filtering mechanism. Its input consists of the lower bits of the DLF (which determine the fractional output value) and its logic is driven by a high frequency clock NS_CLK (usually, a divided down version of the LO output, as supplied the noise shaping divider 414) to avail the required averaging effect (that generates a virtual fractional frequency state out of an integer frequency ladder). The main drawback or limitation of such circuitry may be that the Noise Shaping Logic (NSL) computes (in each cycle of the NS_CLK) the NS input of the DCO during the next NS_CLK cycle. This may require the NSL to operate directly at the NS_CLK frequency, putting at odds, the complexity of the filter and the actual operation frequency.

To complete the high-level description of the system's operation, the sub-band (a CT value) is usually selected prior to activation of the phase locking loop, during a process termed the Automatic Band Selection (ABS). Upon completion of this process, the phase locking loop takes over, computing the phase error (PH_ERR) at the output of the Digital Phase Detector (DPD) which is fed a new relative phase sample (by the TDC) every single reference clock.

The proposed method circumvents the high-operational frequency (of the Sigma-Delta Modulator) requirement through:

a) precomputing frequency modulation streams (e.g. the plurality of frequency setting values) at the rate of reference clock, b) storing them into a small dedicated memory array (e.g. the memory circuitry) and then, c) feeding the stream (e.g. the frequency setting signal), value by value, at a rate of up-to the LO frequency, to a dedicated DCO frequency control element.

Such an approach may alleviate the constraint of high physical frequency resolution at the DCO. Higher-rate noise shaping and/or more complex noise shaping scheme may allow higher spectral purity signals.

FIG. 5a shows a schematic outline of the ADPLL as used in various examples. The ADPLL of FIG. 5a may be implemented similar to the ADPLL of FIG. 4a, but may use a DCO 100 and DLF 200 as shown in connection with FIGS. 1a to 2b, instead of the DCO and DLF used in FIG. 4a. FIG. 5b shows a schematic structure of the Digital Loop Filter (DLF). FIG. 5b depicts a DLF structure that is supplemented by the proposed mechanisms that are introduced in connection with FIGS. 2a and 2b. The filter may start with the Loop Filter Logic (LFL) 24, e.g. the frequency setting signal generation circuitry 24, that transforms the phase error (PH_ERR) into a frequency setting (TUNE) of the DCO. The MSB may be sampled with the REF_CLK and to be subsequently fed (directly) to the FT control of the DCO, e.g. via memory 27b. The lower bits (which may constitute the fractional frequency value) may be fed into the new Noise Shaper Logic (NSL), e.g. the noise shaping signal generation circuitry 26, which computes (e.g. in parallel), a number (equal roughly the frequency ratio of the NS_CLK and the REF_CLK—termed ns2ref in the figure) of Noise Shaper (NS) inputs to be fed into the respective input of the DCO during the (entire) next REF_CLK cycle. The total output of the NSL is sampled into a register file (e.g. memory 27*a*) having nsh2ref rows, each comprising or consisting of NS_WIDTH bits.

FIG. 5*c* shows the proposed structure of the DCO. The DCO of FIG. 5*c* is implemented similar to the DCO of FIG. 4*b*, except for the selection circuitry 14. A counter 14*a* is used to decide which output should be routed through the MUX 14*b* and into the noise-shaping (NS) input of the DCO. The selected output is routed through to control the NS capacitors of the resonant circuit 16 (e.g. the signal generation circuitry), and the CT and FT signals are routed through to the respective control circuitry of the CT and FT capacitors. For small NS2REF ratios and/or high NS_CLK frequencies, it may be advisable to employ a cyclic shift register (see example in FIG. 5*d*). Otherwise, an arithmetic or a ripple counter may provide a better (in terms of area/power) alternative.

Figure 5D:
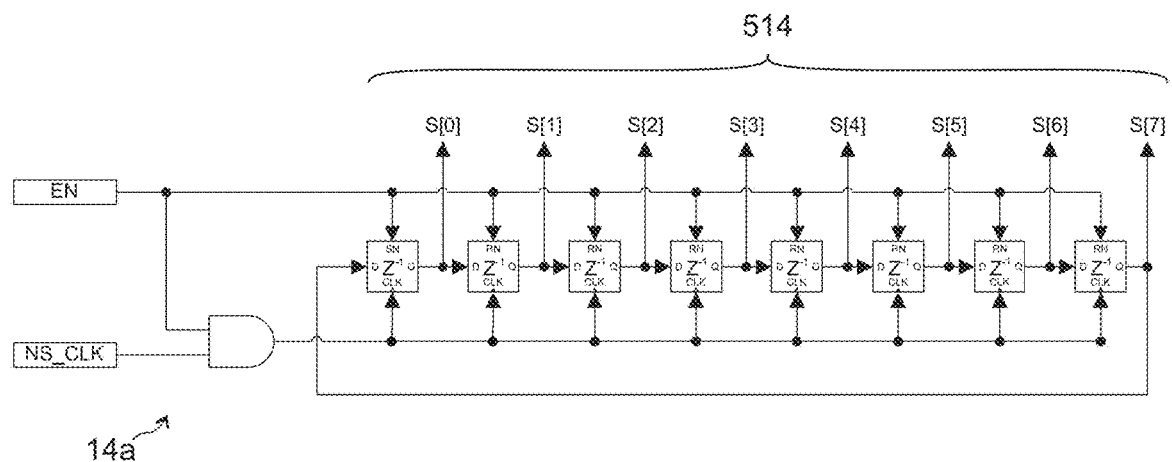
FIG. 5d shows a schematic structure of an example of a cyclic shift register.

FIG. 5*d* Example of cyclic shift register 14*a* of 8 outputs 514. While EN=0, the output of the first FF (FlipFlop) is set to 1 while the rest are reset to 0. Then, asserting EN=1, enables the NS_CLK input on every FF, shifting the single "1" (initially present at the output S[0]) to S[1] at the first NS_CLK rise, then to S[2] (at the second NS_CLK rise) etc. After 8 clocks, completing the loop the "1" returns to the output S[0]. Due to small calculation delay of each stage, such a structure can support very high frequencies of operation.

The proposed update to the DPLL architecture is shown schematically in FIG. 5*a*. The transfer of the NSL from DCO to the DLF domain with operation at REF_CLK frequency (frequency of the reference signal), allows application of VLSI synthesis with extensive optimization of the entire TUNE generating data-path. Fractional frequency capabilities at high repetition-rates are especially useful in quantization-limited (as opposed to noise-limited) PLLs operating at high reference clock frequencies.

The following example, shows a Bang-Bang TDC based Integer-ADPLL, operating at $f_{REF}$=2 GHz. The KDCO (oscillator gain) of the 30 GHz DCO incorporated in the system is ~800 MHz/Full scale. Assuming a reasonable FT matrix size of 256 capacitors, the resulting bit gain is significantly larger than the standard deviation of the system noise—a fact that makes the behavior of the loop limit-cycle dominated and all-but denies effective control over the locking bandwidth.

Figure 6A:
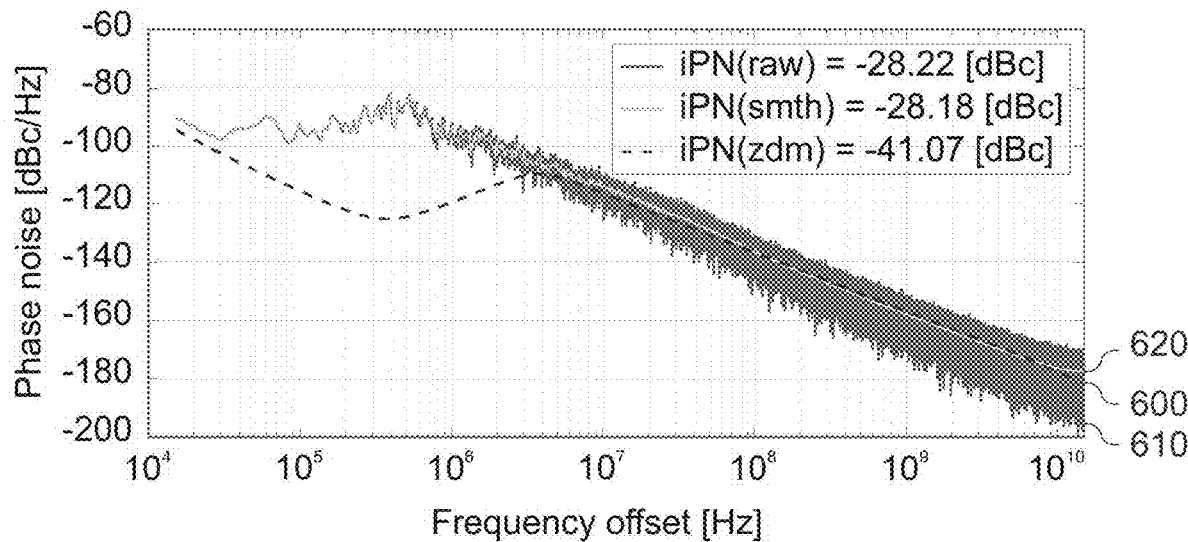
FIGS. 6a and 6b show exemplary phase-noise curves.

An exemplary phase noise profile under such conditions is shown in FIG. 6*a*. The (dashed) curve 600 is the Z-domain analytical calculation of the expected PLL phase-noise based on DCO and REF phase-noise PSDs. The curves 610 and 620, are simulated (in time-domain, including all the real quantization effects) phase noise PSDs (raw and smoothed, respectively) of the PLL.

Figure 6B:
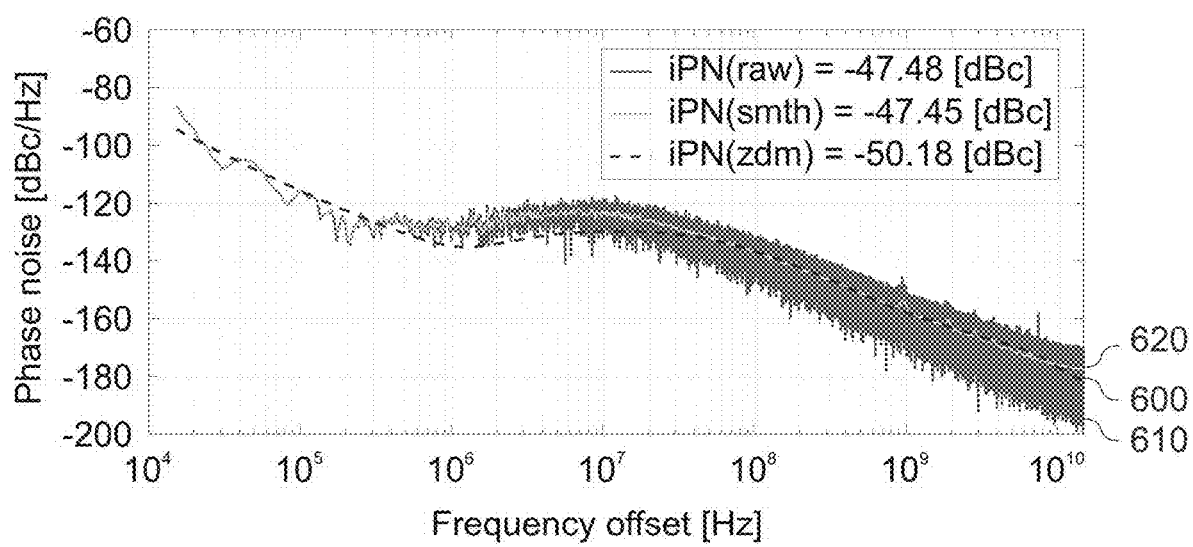

Strong noise coloring stemming from the limit-cycle effect is visible, and so is the discrepancy with the analytically (Z-domain) expected result. Now, applying 1-order Sigma-Delta with NSH CLK frequency of 15 GHz, FIG. 6*b* is obtained. The control over bandwidth is significantly better as stems from the correspondence of the time-domain and the z-domain results.

An example of an implementation using a PLL according to one or more aspects of the proposed architecture or one or more examples described above is illustrated in FIGS. 7 and 8. For example, the PLL may be used in transmitter circuitry or receiver circuitry of a user device or a of base station, or in a baseband processor of the user device or of the base station. Examples thus provide a user device or a base station, comprising a PLL with a DLF and/or a DCO as shown in connection with FIGS. 1*a* to 3, 5*a* to 5*d*.

Figure 7:
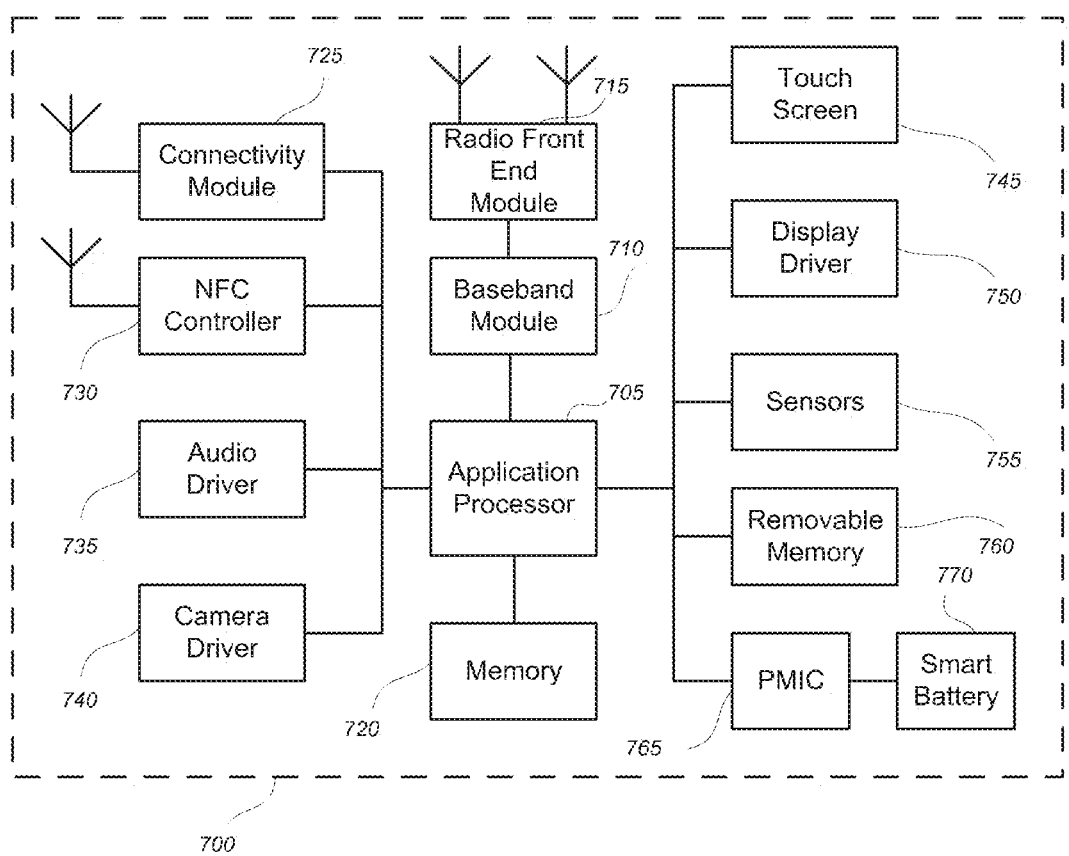
FIG. 7 illustrates a user device.

FIG. 7 illustrates a user device 700 in accordance with an aspect. The user device 700 may be a mobile device in some aspects and includes an application processor 705, baseband processor 710 (also referred to as a baseband module), radio front end module (RFEM) 715, memory 720, connectivity module 725, near field communication (NFC) controller 730, audio driver 735, camera driver 740, touch screen 745, display driver 750, sensors 755, removable memory 760, power management integrated circuit (PMIC) 765 and smart battery 770.

In some aspects, application processor 705 may include, for example, one or more CPU cores and one or more of cache memory, low drop-out voltage regulators (LDOs), interrupt controllers, serial interfaces such as serial peripheral interface (SPI), inter-integrated circuit ($I^2FC$) or universal programmable serial interface module, real time clock (RTC), timer-counters including interval and watchdog timers, general purpose input-output (IO), memory card controllers such as secure digital/multi-media card (SD/MMC) or similar, universal serial bus (USB) interfaces, mobile industry processor interface (MIPI) interfaces and Joint Test Access Group (JTAG) test access ports.

In some aspects, baseband module 710 may be implemented, for example, as a solder-down substrate including one or more integrated circuits, a single packaged integrated circuit soldered to a main circuit board, and/or a multi-chip module containing two or more integrated circuits.

Figure 8:
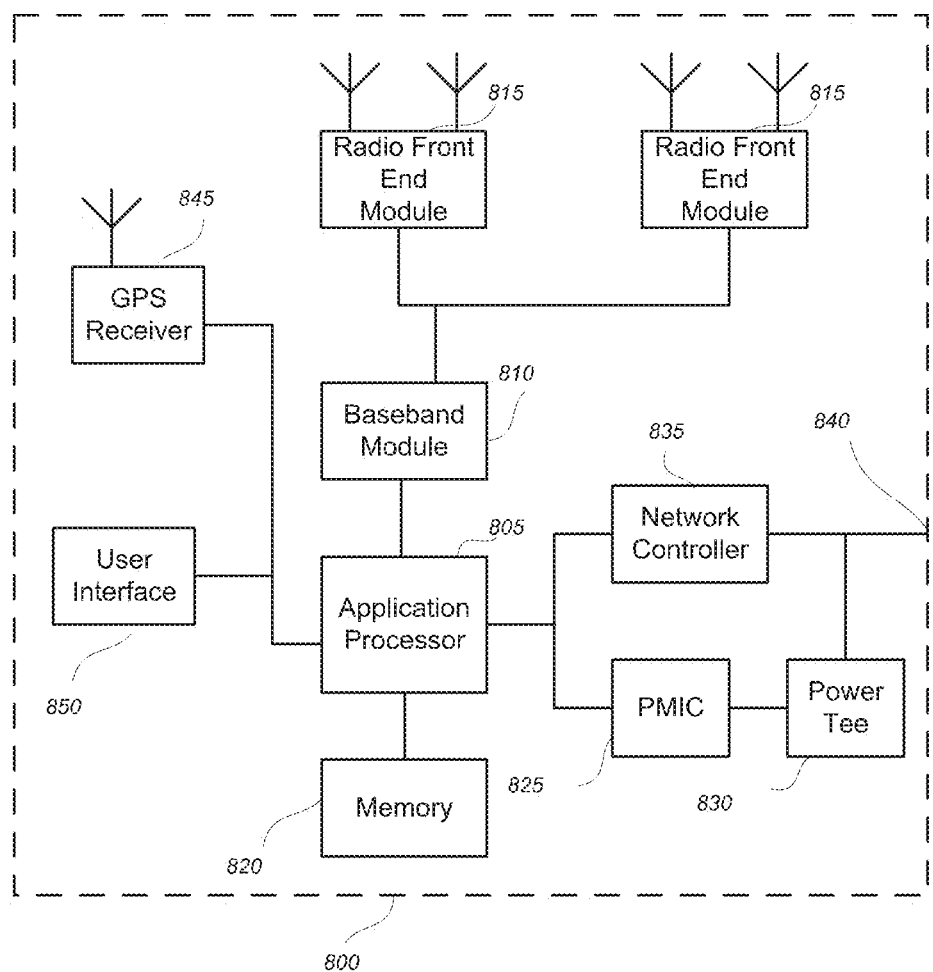
FIG. 8 illustrates a base station.

FIG. 8 illustrates a base station or infrastructure equipment radio head 800 in accordance with an aspect. The base station radio head 800 may include one or more of application processor 805, baseband modules 810, one or more radio front end modules 815, memory 820, power management circuitry 825, power tee circuitry 830, network controller 835, network interface connector 840, satellite navigation receiver module 845, and user interface 850.

In some aspects, application processor 805 may include one or more CPU cores and one or more of cache memory, low drop-out voltage regulators (LDOs), interrupt controllers, serial interfaces such as SPI, $I^2C$ or universal programmable serial interface module, real time clock (RTC), timer-counters including interval and watchdog timers, general purpose IO, memory card controllers such as SD/MMC or similar, USB interfaces, MIPI interfaces and Joint Test Access Group (JTAG) test access ports.

In some aspects, baseband processor 810 may be implemented, for example, as a solder-down substrate including one or more integrated circuits, a single packaged integrated circuit soldered to a main circuit board or a multi-chip module containing two or more integrated circuits.

In some aspects, memory 820 may include one or more of volatile memory including dynamic random access memory (DRAM) and/or synchronous dynamic random access memory (SDRAM), and nonvolatile memory (NVM) including high-speed electrically erasable memory (commonly referred to as Flash memory), phase change random access memory (PRAM), magnetoresistive random access memory (MRAM) and/or a three-dimensional crosspoint memory. Memory 820 may be implemented as one or more of solder down packaged integrated circuits, socketed memory modules and plug-in memory cards.

In some aspects, power management integrated circuitry 825 may include one or more of voltage regulators, surge protectors, power alarm detection circuitry and one or more backup power sources such as a battery or capacitor. Power alarm detection circuitry may detect one or more of brown out (under-voltage) and surge (over-voltage) conditions.

In some aspects, power tee circuitry 830 may provide for electrical power drawn from a network cable to provide both power supply and data connectivity to the base station radio head 800 using a single cable.

In some aspects, network controller 835 may provide connectivity to a network using a standard network interface protocol such as Ethernet. Network connectivity may be provided using a physical connection which is one of electrical (commonly referred to as copper interconnect), optical or wireless.

In some aspects, satellite navigation receiver module 845 may include circuitry to receive and decode signals transmitted by one or more navigation satellite constellations such as the global positioning system (GPS), Globalnaya Navigatsionnaya Sputnikovaya Sistema (GLONASS), Galileo and/or BeiDou. The receiver 845 may provide data to application processor 805 which may include one or more of position data or time data. Application processor 805 may use time data to synchronize operations with other radio base stations.

In some aspects, user interface 850 may include one or more of physical or virtual buttons, such as a reset button, one or more indicators such as light emitting diodes (LEDs) and a display screen.

The aspects and features mentioned and described together with one or more of the previously detailed examples and figures, may as well be combined with one or more of the other examples in order to replace a like feature of the other example or in order to additionally introduce the feature to the other example.

Example 1 relates to a digitally controlled oscillator circuit arrangement (100), comprising input circuitry (12) for obtaining a frequency setting signal, the frequency setting signal comprising a plurality of signal components. The digitally controlled oscillator circuit arrangement (100) comprises selection circuitry (14) for selecting one signal component of the plurality of signal components of the frequency setting signal based on an oscillation signal of the digitally controlled oscillator circuit arrangement. The digitally controlled oscillator circuit arrangement (100) comprises signal generation circuitry (16) for generating the oscillation signal based on the selected signal component of the frequency setting signal. The digitally controlled oscillator circuit arrangement (100) comprises output circuitry (18) for providing the oscillation signal.

In Example 2, the subject matter of example 1 or any of the Examples described herein may further include, that the selection circuitry comprises counting circuitry (14a) and multiplexing circuitry (14b), the multiplexing circuitry being configured to select the signal component of the frequency setting signal based on a counting signal of the counting circuitry, the counting circuitry being configured to generate the counting signal based on the oscillation signal of the digitally controlled oscillator.

In Example 3, the subject matter of example 2 or any of the Examples described herein may further include, that the counting circuitry is configured to control the multiplexing circuitry to select a different signal component of the frequency setting signal at a rate corresponding to an oscillation frequency of the oscillation signal.

In Example 4, the subject matter of example 2 or any of the Examples described herein may further include, that the counting circuitry is configured to control the multiplexing circuitry to select a different signal component of the frequency setting signal at a fraction of a rate corresponding to an oscillation frequency of the oscillation signal.

In Example 5, the subject matter of one of the examples 2 to 4 or any of the Examples described herein may further include, that the counting circuitry is implemented using one of a cyclic shift register, an arithmetic counter and a ripple counter.

In Example 6, the subject matter of one of the examples 1 to 5 or any of the Examples described herein may further include, that the frequency setting signal is based on a signal indicative of a timing difference between a reference signal and the oscillation signal, wherein the plurality of signal components comprises N signal components, wherein the signal generation circuitry is configured to sequentially use the N signal components to adjust the oscillation signal during a single period of the reference signal.

In Example 7, the subject matter of one of the examples 1 to 6 or any of the Examples described herein may further include, that the input circuitry is configured to obtain a second frequency setting signal and a third frequency setting signal, the second frequency setting signal being suitable for adjusting the frequency of the oscillation signal in integer steps, the third frequency setting signal being suitable for selecting a frequency band of the oscillation signal, wherein the signal generation circuitry is configured to generate the oscillation signal further based on the second and third frequency setting signals.

In Example 8, the subject matter of example 7 or any of the Examples described herein may further include, that the frequency setting signal is a fractional frequency setting signal, that the second frequency setting signal is an integer frequency setting signal, and that the third frequency setting signal is a frequency band setting signal.

In Example 9, the subject matter of one of the examples 1 to 8 or any of the Examples described herein may further include, that the usage of alternating values in the frequency setting signal across a reference signal cycle results in a fractional frequency setting of the oscillation signal.

In Example 10, the subject matter of one of the examples 1 to 9 or any of the Examples described herein may further include, that the frequency setting signal is suitable for noise shaping the frequency error of the oscillation signal.

Example 11 relates to a digital loop filter circuit arrangement (200), comprising input circuitry (22) for obtaining a signal indicative of a timing difference between a reference signal and an oscillation signal of a digitally controlled oscillator circuit arrangement. The digital loop filter circuit arrangement (200) comprises frequency setting signal generation circuitry (24) configured to generate, for each signal period of the reference signal, an integer and a fractional frequency setting, for adjusting the frequency of the digitally controlled oscillator circuit arrangement based on the signal indicative of a timing difference. The digital loop filter circuit arrangement (200) comprises noise shaping signal generation circuitry (26) that is configured to process the fractional frequency setting into a plurality of frequency setting values. The digital loop filter circuit arrangement (200) comprises output circuitry (28) for providing a frequency setting signal for the digitally controlled oscillator circuit arrangement, the frequency setting signal comprising a plurality of signal components, the plurality of signal components being based on the plurality of frequency setting values.

In Example 12, the subject matter of example 11 or any of the Examples described herein may further include, that the plurality of frequency setting values are generated in parallel.

In Example 13, the subject matter of example 12 or any of the Examples described herein may further include, that the plurality of frequency setting values are generated based on an closed-form expression that is based on the required fractional frequency setting.

In Example 14, the subject matter of one of the examples 11 to 13 or any of the Examples described herein may further include, that the digital loop filter circuit arrangement comprises memory circuitry, wherein the frequency setting signal generation circuitry is configured to store the plurality of frequency setting values using the memory circuitry, and wherein the output circuitry is configured to generate the frequency setting signal using the plurality of frequency setting values stored in the memory circuitry.

In Example 15, the subject matter of one of the examples 11 to 14 or any of the Examples described herein may further include, that the plurality of signal component of the frequency setting signal are provided in parallel to the digitally controlled oscillator circuit arrangement.

In Example 16, the subject matter of one of the examples 11 to 15 or any of the Examples described herein may further include, that the plurality of signal components are each provided via individual signal lines to the digitally controlled oscillator circuit arrangement.

In Example 17, the subject matter of one of the examples 11 to 16 or any of the Examples described herein may further include, that the plurality of signal components are updated at the same time within the frequency setting signal.

In Example 18, the subject matter of one of the examples 11 to 17 or any of the Examples described herein may further include, that the frequency setting signal is suitable for adjusting a fractional frequency setting of the oscillation signal.

In Example 19, the subject matter of one of the examples 11 to 18 or any of the Examples described herein may further include, that the frequency setting signal is suitable for noise shaping of the frequency error of the oscillation signal.

In Example 20, the subject matter of one of the examples 11 to 19 or any of the Examples described herein may further include, that the frequency setting signal generation circuitry is configured to generate a second frequency setting signal based on the integer frequency setting, the second frequency setting signal being suitable for adjusting the frequency of the oscillation signal in integer steps, wherein the output circuitry is configured to provide the second frequency setting signal to the digitally controlled oscillator circuit arrangement.

In Example 21, the subject matter of example 20 or any of the Examples described herein may further include, that the frequency setting signal is updated at the same frequency as the second frequency setting signal.

Example 22 relates to a phase locked loop circuit arrangement, comprising the digitally controlled oscillator circuit arrangement according to one of the examples 1 to 10 and the digital loop filter circuit arrangement according to one of the examples 11 to 21.

In Example 23, the subject matter of example 22 or any of the Examples described herein may further include a phase detector, configured to generate the signal indicative of the time difference based on the reference signal and based on the oscillation signal.

In Example 24, the subject matter of one of the examples 22 to 23 or any of the Examples described herein may further include, that the phase locked loop circuit arrangement is an all-digital phase locked loop circuit arrangement.

Example 25 relates to a digitally controlled oscillating means (100), comprising input means (12) for obtaining a frequency setting signal, the frequency setting signal comprising a plurality of signal components. The digitally controlled oscillating means (100) comprises selection means (14) for selecting one signal component of the plurality of signal components of the frequency setting signal based on an oscillation signal of the digitally controlled oscillating means. The digitally controlled oscillating means (100) comprises signal generation means (16) for generating the oscillation signal based on the selected signal component of the frequency setting signal. The digitally controlled oscillating means (100) comprises output means (18) for providing the oscillation signal.

In Example 26, the subject matter of example 25 or any of the Examples described herein may further include, that the selection means comprises counting means (14*a*) and multiplexing means (14*b*), the multiplexing means being configured for selecting the signal component of the frequency setting signal based on a counting signal of the counting means, the counting means being configured for generating the counting signal based on the oscillation signal of the digitally controlled oscillator.

In Example 27, the subject matter of example 26 or any of the Examples described herein may further include, that the counting means is configured for controlling the multiplexing means to select a different signal component of the frequency setting signal at a rate corresponding to an oscillation frequency of the oscillation signal.

In Example 28, the subject matter of example 26 or any of the Examples described herein may further include, that the counting means is configured for controlling the multiplexing means to select a different signal component of the frequency setting signal at a fraction of a rate corresponding to an oscillation frequency of the oscillation signal.

In Example 29, the subject matter of one of the examples 26 to 28 or any of the Examples described herein may further include, that the counting means is implemented using one of a cyclic shift register, an arithmetic counter and a ripple counter.

In Example 30, the subject matter of one of the examples 25 to 29 or any of the Examples described herein may further include, that the frequency setting signal is based on a signal indicative of a timing difference between a reference signal and the oscillation signal, wherein the plurality of signal components comprises N signal components, wherein the signal generation means is configured for sequentially using the N signal components to adjust the oscillation signal during a single period of the reference signal.

In Example 31, the subject matter of one of the examples 25 to 30 or any of the Examples described herein may further include, that the input means is configured for obtain a second frequency setting signal and a third frequency setting signal, the second frequency setting signal being suitable for adjusting the frequency of the oscillation signal in integer steps, the third frequency setting signal being suitable for selecting a frequency band of the oscillation signal, wherein the signal generation means is configured for generating the oscillation signal further based on the second and third frequency setting signals.

In Example 32, the subject matter of example 31 or any of the Examples described herein may further include, that the frequency setting signal is a fractional frequency setting signal, that the second frequency setting signal is an integer frequency setting signal, and that the third frequency setting signal is a frequency band setting signal.

In Example 33, the subject matter of one of the examples 25 to 32 or any of the Examples described herein may further include, that the usage of alternating values in the frequency setting signal across a reference signal cycle results in a fractional frequency setting of the oscillation signal.

In Example 34, the subject matter of one of the examples 25 to 33 or any of the Examples described herein may further include, that the frequency setting signal is suitable for noise shaping the frequency error of the oscillation signal.

Example 35 relates to a digital loop filtering means (200), comprising input means (22) for obtaining a signal indicative of a timing difference between a reference signal and an oscillation signal of a digitally controlled oscillating means. The digital loop filtering means (200) comprises frequency setting signal generation means (24) configured for generating, for each signal period of the reference signal, an integer and a fractional frequency setting, for adjusting the frequency of the digitally controlled oscillating means based on the signal indicative of a timing difference. The digital loop filtering means (200) comprises noise shaping signal generation means (26) that is configured for processing the fractional frequency setting into a plurality of frequency setting values. The digital loop filtering means (200) comprises output means (28) for providing a frequency setting signal for the digitally controlled oscillating means, the frequency setting signal comprising a plurality of signal components, the plurality of signal components being based on the plurality of frequency setting values.

In Example 36, the subject matter of example 35 or any of the Examples described herein may further include, that the plurality of frequency setting values are generated in parallel.

In Example 37, the subject matter of example 36 or any of the Examples described herein may further include, that the plurality of frequency setting values are generated based on an closed-form expression that is based on the required fractional frequency setting.

In Example 38, the subject matter of one of the examples 35 to 37 or any of the Examples described herein may further include, that the digital loop filtering means comprises memory means, wherein the frequency setting signal generation means is configured for storing the plurality of frequency setting values using the memory means, and wherein the output means is configured for generating the frequency setting signal using the plurality of frequency setting values stored in the memory means.

In Example 39, the subject matter of one of the examples 35 to 38 or any of the Examples described herein may further include, that the plurality of signal component of the frequency setting signal are provided in parallel to the digitally controlled oscillating means.

In Example 40, the subject matter of one of the examples 35 to 39 or any of the Examples described herein may further include, that the plurality of signal components are each provided via individual signal lines to the digitally controlled oscillating means.

In Example 41, the subject matter of one of the examples 35 to 40 or any of the Examples described herein may further include, that the plurality of signal components are updated at the same time within the frequency setting signal.

In Example 42, the subject matter of one of the examples 35 to 41 or any of the Examples described herein may further include, that the frequency setting signal is suitable for adjusting a fractional frequency setting of the oscillation signal.

In Example 43, the subject matter of one of the examples 35 to 42 or any of the Examples described herein may further include, that the frequency setting signal is suitable for noise shaping of the frequency error of the oscillation signal.

In Example 44, the subject matter of one of the examples 35 to 43 or any of the Examples described herein may further include, that the frequency setting signal generation means is configured for generating a second frequency setting signal based on the integer frequency setting, the second frequency setting signal being suitable for adjusting the frequency of the oscillation signal in integer steps, wherein the output means is configured for providing the second frequency setting signal to the digitally controlled oscillating means.

In Example 45, the subject matter of example 44 or any of the Examples described herein may further include, that the frequency setting signal is updated at the same frequency as the second frequency setting signal.

Example 46 relates to a phase locked loop, comprising the digitally controlled oscillating means according to one of the examples 25 to 34 and the digital loop filtering means according to one of the examples 35 to 45.

In Example 47, the subject matter of example 46 or any of the Examples described herein may further include a phase detector, configured for generating the signal indicative of the time difference based on the reference signal and based on the oscillation signal.

In Example 48, the subject matter of one of the examples 22 to 23 or any of the Examples described herein may further include, that the phase locked loop is an all-digital phase locked loop.

Example 49 relates to a method for a digitally controlled oscillator, the method comprising obtaining (110) a frequency setting signal, the frequency setting signal comprising a plurality of signal components. The method comprises selecting (120) one signal component of the plurality of signal components of the frequency setting signal based on an oscillation signal of the digitally controlled oscillator. The method comprises generating (140) the oscillation signal based on the selected signal component of the frequency setting signal. The method comprises providing (150) the oscillation signal.

In Example 50, the subject matter of example 49 or any of the Examples described herein may further include, that the selecting comprises generating (122) a counting signal and using (124) multiplexing for selecting the signal component of the frequency setting signal based on the counting signal, the counting signal being generated based on the oscillation signal of the digitally controlled oscillator.

In Example 51, the subject matter of example 50 or any of the Examples described herein may further include, that the method comprises selecting (120), using the counting signal for the multiplexing, a different signal component of the frequency setting signal at a rate corresponding to an oscillation frequency of the oscillation signal.

In Example 52, the subject matter of example 50 or any of the Examples described herein may further include, that the method comprises selecting (120), using the counting signal for the multiplexing, a different signal component of the frequency setting signal at a fraction of a rate corresponding to an oscillation frequency of the oscillation signal.

In Example 53, the subject matter of one of the examples 50 to 52 or any of the Examples described herein may further include, that the counting signal is generated using one of a cyclic shift register, an arithmetic counter and a ripple counter.

In Example 54, the subject matter of one of the examples 49 to 53 or any of the Examples described herein may further include, that the frequency setting signal is based on a signal indicative of a timing difference between a reference signal and the oscillation signal, wherein the plurality of signal components comprises N signal components, wherein the method comprises sequentially using the N signal components to adjust the oscillation signal during a single period of the reference signal.

In Example 55, the subject matter of one of the examples 49 to 54 or any of the Examples described herein may further include, that the method comprises obtaining (130) a second frequency setting signal and a third frequency setting signal, the second frequency setting signal being suitable for adjusting the frequency of the oscillation signal in integer steps, the third frequency setting signal being suitable for selecting a frequency band of the oscillation signal, wherein the oscillation signal is generated (140) further based on the second and third frequency setting signals.

In Example 56, the subject matter of example 55 or any of the Examples described herein may further include, that the frequency setting signal is a fractional frequency setting signal, that the second frequency setting signal is an integer frequency setting signal, and that the third frequency setting signal is a frequency band setting signal.

In Example 57, the subject matter of one of the examples 49 to 56 or any of the Examples described herein may further include, that the usage of alternating values in the frequency setting signal across a reference signal cycle results in a fractional frequency setting of the oscillation signal.

In Example 58, the subject matter of one of the examples 49 to 57 or any of the Examples described herein may further include, that the frequency setting signal is suitable for noise shaping the frequency error of the oscillation signal.

Example 59 relates to a method for a digital loop filter, the method comprising obtaining (210) a signal indicative of a timing difference between a reference signal and an oscillation signal of a digitally controlled oscillator. The method comprises generating (220), for each signal period of the reference signal, an integer and a fractional frequency setting, for adjusting the frequency of the digitally controlled oscillator based on the signal indicative of a timing difference. The method comprises processing (230) the fractional frequency setting into a plurality of frequency setting values. The method comprises providing (240) a frequency setting signal for the digitally controlled oscillator, the frequency setting signal comprising a plurality of signal components, the plurality of signal components being based on the plurality of frequency setting values.

In Example 60, the subject matter of example 59 or any of the Examples described herein may further include, that the plurality of frequency setting values are generated in parallel.

In Example 61, the subject matter of example 60 or any of the Examples described herein may further include, that the plurality of frequency setting values are generated based on an closed-form expression that is based on the required fractional frequency setting.

In Example 62, the subject matter of one of the examples 59 to 61 or any of the Examples described herein may further include, that the method comprises storing (222) the plurality of frequency setting values using a memory, and wherein the frequency setting signal is generated using the plurality of frequency setting values stored in the memory.

In Example 63, the subject matter of one of the examples 59 to 62 or any of the Examples described herein may further include, that the plurality of signal component of the frequency setting signal are provided in parallel to the digitally controlled oscillator.

In Example 64, the subject matter of one of the examples 59 to 63 or any of the Examples described herein may further include, that the plurality of signal components are each provided via individual signal lines to the digitally controlled oscillator.

In Example 65, the subject matter of one of the examples 59 to 64 or any of the Examples described herein may further include, that the plurality of signal components are updated at the same time within the frequency setting signal.

In Example 66, the subject matter of one of the examples 59 to 65 or any of the Examples described herein may further include, that the frequency setting signal is suitable for adjusting a fractional frequency setting of the oscillation signal.

In Example 67, the subject matter of one of the examples 59 to 66 or any of the Examples described herein may further include, that the frequency setting signal is suitable for noise shaping the frequency error of the oscillation signal.

In Example 68, the subject matter of one of the examples 59 to 67 or any of the Examples described herein may further include, that the method comprises generating (250) a second frequency setting signal based on the integer frequency setting, the second frequency setting signal being suitable for adjusting the frequency of the oscillation signal in integer steps, and providing (260) the second frequency setting signal to the digitally controlled oscillator.

In Example 69, the subject matter of example 68 or any of the Examples described herein may further include, that the frequency setting signal is updated at the same frequency as the second frequency setting signal.

Example 70 relates to a user device, comprising the phase locked loop circuit arrangement according to one of the examples 22 to 24 or the phase locked loop according to one of the examples 46 to 48.

Example 71 relates to a base station, comprising the phase locked loop circuit arrangement according to one of the examples 22 to 24 or the phase locked loop according to one of the examples 46 to 48.

Example 72 relates to a machine readable storage medium including program code, when executed, to cause a machine to perform the method of one of the examples 49 to 58, or the method of one of the examples 59 to 69.

Example 73 relates to a computer program having a program code for performing the method of one of the examples 49 to 58, or the method of one of the examples 59 to 69, when the computer program is executed on a computer, a processor, or a programmable hardware component.

Example 74 relates to a machine readable storage including machine readable instructions, when executed, to implement a method or realize an apparatus as claimed in any pending claim or shown in any Example.

Examples may further be or relate to a computer program having a program code for performing one or more of the above methods, when the computer program is executed on a computer or processor. Steps, operations or processes of various above-described methods may be performed by programmed computers or processors. Examples may also cover program storage devices such as digital data storage media, which are machine, processor or computer readable and encode machine-executable, processor-executable or computer-executable programs of instructions. The instructions perform or cause performing some or all of the acts of the above-described methods. The program storage devices may comprise or be, for instance, digital memories, magnetic storage media such as magnetic disks and magnetic tapes, hard drives, or optically readable digital data storage media. Further examples may also cover computers, processors or control units programmed to perform the acts of the above-described methods or (field) programmable logic arrays ((F) PLAs) or (field) programmable gate arrays ((F) PGAs), programmed to perform the acts of the above-described methods.

Examples thus provide a machine readable storage medium including program code, when executed, to cause a machine to perform the method of one of FIG. 1a or 2b. Examples provide a computer program having a program code for performing the method of one of FIG. 1a or 2b, when the computer program is executed on a computer, a processor, or a programmable hardware component. Examples further provide a machine readable storage including machine readable instructions, when executed, to implement a method or realize an apparatus as described in connection with FIGS. 1a to 3, 5a to 5d.

The description and drawings merely illustrate the principles of the disclosure. Furthermore, all examples recited herein are principally intended expressly to be only for illustrative purposes to aid the reader in understanding the principles of the disclosure and the concepts contributed by the inventor(s) to furthering the art. All statements herein reciting principles, aspects, and examples of the disclosure, as well as specific examples thereof, are intended to encompass equivalents thereof.

A functional block denoted as "means for . . . " performing a certain function may refer to a circuit that is configured to perform a certain function. Hence, a "means for s.th." may be implemented as a "means configured to or suited for s.th.", such as a device or a circuit configured to or suited for the respective task.

Functions of various elements shown in the figures, including any functional blocks labeled as "means", "means for providing a signal", "means for generating a signal.", etc., may be implemented in the form of dedicated hardware, such as "a signal provider", "a signal processing unit", "a processor", "a controller", etc. as well as hardware capable of executing software in association with appropriate software. When provided by a processor, the functions may be provided by a single dedicated processor, by a single shared processor, or by a plurality of individual processors, some of which or all of which may be shared. However, the term "processor" or "controller" is by far not limited to hardware exclusively capable of executing software, but may include digital signal processor (DSP) hardware, network processor, application specific integrated circuit (ASIC), field programmable gate array (FPGA), read only memory (ROM) for storing software, random access memory (RAM), and non-volatile storage. Other hardware, conventional and/or custom, may also be included.

A block diagram may, for instance, illustrate a high-level circuit diagram implementing the principles of the disclosure. Similarly, a flow chart, a flow diagram, a state transition diagram, a pseudo code, and the like may represent various processes, operations or steps, which may, for instance, be substantially represented in computer readable medium and so executed by a computer or processor, whether or not such computer or processor is explicitly shown. Methods disclosed in the specification or in the claims may be implemented by a device having means for performing each of the respective acts of these methods.

It is to be understood that the disclosure of multiple acts, processes, operations, steps or functions disclosed in the specification or claims may not be construed as to be within the specific order, unless explicitly or implicitly stated otherwise, for instance for technical reasons. Therefore, the disclosure of multiple acts or functions will not limit these to a particular order unless such acts or functions are not interchangeable for technical reasons. Furthermore, in some examples a single act, function, process, operation or step may include or may be broken into multiple sub-acts, -functions, -processes, -operations or -steps, respectively. Such sub acts may be included and part of the disclosure of this single act unless explicitly excluded.

Furthermore, the following claims are hereby incorporated into the detailed description, where each claim may stand on its own as a separate example. While each claim may stand on its own as a separate example, it is to be noted that—although a dependent claim may refer in the claims to a specific combination with one or more other claims—other examples may also include a combination of the dependent claim with the subject matter of each other dependent or independent claim. Such combinations are explicitly proposed herein unless it is stated that a specific combination is not intended. Furthermore, it is intended to include also features of a claim to any other independent claim even if this claim is not directly made dependent to the independent claim.

What is claimed is:

1. A digitally controlled oscillator circuit arrangement comprising:
    input circuitry for obtaining a frequency setting signal, the frequency setting signal comprising a plurality of signal components;
    selection circuitry for selecting one signal component of the plurality of signal components of the frequency setting signal based on an oscillation signal of the digitally controlled oscillator circuit arrangement,
        wherein the selection circuitry comprises counting circuitry and multiplexing circuitry, wherein
            the multiplexing circuitry is configured to select the signal component of the frequency setting signal based on a counting signal of the counting circuitry, and
            the counting circuitry is configured to generate the counting signal based on the oscillation signal of the digitally controlled oscillator;
    signal generation circuitry for generating the oscillation signal based on the selected signal component of the frequency setting signal; and
    output circuitry for providing the oscillation signal.

2. The digitally controlled oscillator circuit arrangement according to claim 1, wherein the counting circuitry is configured to control the multiplexing circuitry to select a different signal component of the frequency setting signal at a rate corresponding to an oscillation frequency of the oscillation signal.

3. The digitally controlled oscillator circuit arrangement according to claim 1, wherein the counting circuitry is configured to control the multiplexing circuitry to select a different signal component of the frequency setting signal at a fraction of a rate corresponding to an oscillation frequency of the oscillation signal.

4. The digitally controlled oscillator circuit arrangement according to claim 1, wherein the counting circuitry is implemented using one of a cyclic shift register, an arithmetic counter and a ripple counter.

5. The digitally controlled oscillator circuit arrangement according to claim 1, wherein the frequency setting signal is based on a signal indicative of a timing difference between a reference signal and the oscillation signal, wherein the plurality of signal components comprises N signal components, wherein the signal generation circuitry is configured to sequentially use the N signal components to adjust the oscillation signal during a single period of the reference signal.

6. The digitally controlled oscillator circuit arrangement according to claim 1, wherein the input circuitry is configured to obtain a second frequency setting signal and a third frequency setting signal, the second frequency setting signal being suitable for adjusting the frequency of the oscillation signal in integer steps, the third frequency setting signal being suitable for selecting a frequency band of the oscillation signal, wherein the signal generation circuitry is configured to generate the oscillation signal further based on the second and third frequency setting signals.

7. The digitally controlled oscillator circuit arrangement according to claim 6, wherein the frequency setting signal is a fractional frequency setting signal, wherein the second frequency setting signal is an integer frequency setting signal, and wherein the third frequency setting signal is a frequency band setting signal.

8. The digitally controlled oscillator circuit arrangement according to claim 1, wherein the usage of alternating values in the frequency setting signal across a reference signal cycle results in a fractional frequency setting of the oscillation signal.

9. The digitally controlled oscillator circuit arrangement according to claim 1, wherein the frequency setting signal is suitable for noise shaping the frequency error of the oscillation signal.

10. A digital loop filter circuit arrangement comprising:
input circuitry for obtaining a signal indicative of a timing difference between a reference signal and an oscillation signal of a digitally controlled oscillator circuit arrangement;
memory circuitry;
frequency setting signal generation circuitry configured to generate, for each signal period of the reference signal, an integer and a fractional frequency setting, for adjusting the frequency of the digitally controlled oscillator circuit arrangement based on the signal indicative of a timing difference,
wherein the frequency setting signal generation circuitry is configured to store the plurality of frequency setting values using the memory circuitry;
noise shaping signal generation circuitry that is configured to process the fractional frequency setting into a plurality of frequency setting values; and
output circuitry for providing a frequency setting signal for the digitally controlled oscillator circuit arrangement, the frequency setting signal comprising a plurality of signal components, the plurality of signal components being based on the plurality of frequency setting values,
wherein the output circuitry is configured to generate the frequency setting signal using the plurality of frequency setting values stored in the memory circuitry.

11. The digital loop filter circuit arrangement according to claim 10, wherein the plurality of frequency setting values are generated in parallel.

12. The digital loop filter circuit arrangement according to claim 11, wherein the plurality of frequency setting values are generated based on an closed-form expression that is based on the required fractional frequency setting.

13. The digital loop filter circuit arrangement according to claim 10, wherein the plurality of signal component of the frequency setting signal are provided in parallel to the digitally controlled oscillator circuit arrangement.

14. The digital loop filter circuit arrangement according to claim 10, wherein the plurality of signal components are each provided via individual signal lines to the digitally controlled oscillator circuit arrangement.

15. The digital loop filter circuit arrangement according to claim 10, wherein the plurality of signal components are updated at the same time within the frequency setting signal.

16. The digital loop filter circuit arrangement according to claim 10, wherein the frequency setting signal is suitable for adjusting a fractional frequency setting of the oscillation signal.

17. The digital loop filter circuit arrangement according to claim 10, wherein the frequency setting signal is suitable for noise shaping the frequency error of the oscillation signal.

18. The digital loop filter circuit arrangement according to claim 10, wherein the frequency setting signal generation circuitry is configured to generate a second frequency setting signal based on the integer frequency setting, the second frequency setting signal being suitable for adjusting the frequency of the oscillation signal in integer steps, wherein the output circuitry is configured to provide the second frequency setting signal to the digitally controlled oscillator circuit arrangement.

19. The digital loop filter circuit arrangement according to claim 18, wherein the frequency setting signal is updated at the same frequency as the second frequency setting signal.

20. A phase locked loop circuit arrangement comprising:
a digitally controlled oscillator circuit arrangement comprising;
input circuitry for obtaining a frequency setting signal, the frequency setting signal comprising a plurality of signal components,
selection circuitry for selecting one signal component of the plurality of signal components of the frequency setting signal based on an oscillation signal of the digitally controlled oscillator circuit arrangement,
wherein the selection circuitry comprises counting circuitry and multiplexing circuitry,
signal generation circuitry for generating the oscillation signal based on the selected signal component of the frequency setting signal, and
output circuitry for providing the oscillation signal; and
the digital loop filter circuit arrangement according to claim 10.

21. The phase locked loop circuit arrangement according to claim 20, further comprising a phase detector, configured to generate the signal indicative of the time difference based on the reference signal and based on the oscillation signal.

22. A user device comprising the phase locked loop circuit arrangement according to claim 20.

23. A base station comprising the phase locked loop circuit arrangement according to claim 20.

* * * * *